US012663437B2

(12) United States Patent
Oh et al.

(10) Patent No.: US 12,663,437 B2
(45) Date of Patent: Jun. 23, 2026

(54) TEST SOCKET

(71) Applicant: ISC CO., LTD, Seongnam-si (KR)

(72) Inventors: Jong Woo Oh, Seongnam-si (KR);
Hyun Sik Yoon, Seongnam-si (KR);
Byeung Ju Lee, Seongnam-si (KR)

(73) Assignee: ISC CO., LTD, Seongnam-si (KR)

( * ) Notice: Subject to any disclaimer, the term of this
patent is extended or adjusted under 35
U.S.C. 154(b) by 187 days.

(21) Appl. No.: 18/702,243

(22) PCT Filed: Oct. 17, 2022

(86) PCT No.: PCT/KR2022/015759
§ 371 (c)(1),
(2) Date: Apr. 17, 2024

(87) PCT Pub. No.: WO2023/068708
PCT Pub. Date: Apr. 27, 2023

(65) Prior Publication Data
US 2025/0231218 A1       Jul. 17, 2025

(30) Foreign Application Priority Data

Oct. 18, 2021     (KR) ........................ 10-2021-0138593
Apr. 21, 2022     (KR) ........................ 10-2022-0049285

(51) Int. Cl.
G01R 1/04          (2006.01)
(52) U.S. Cl.
CPC ................................... G01R 1/0458 (2013.01)

(58) Field of Classification Search
CPC .... G01R 1/04; G01R 1/0458; G01R 31/2863;
G01R 31/28; G01R 31/2877; G01R
31/2875
See application file for complete search history.

(56) References Cited

U.S. PATENT DOCUMENTS

| | | | | |
|---|---|---|---|---|
| 7,042,240 | B2 * | 5/2006 | Lopez | ................ G01R 31/2863 |
| | | | | 374/E1.021 |
| 7,956,627 | B2 | 6/2011 | Kasukabe et al. | |
| 7,965,094 | B2 * | 6/2011 | Spielberger | ........ G01R 31/2875 |
| | | | | 324/750.07 |
| 10,802,048 | B2 | 10/2020 | Yamada et al. | |
| 2003/0231027 | A1 * | 12/2003 | Matsuzawa | .......... G01R 1/0458 |
| | | | | 324/750.03 |

(Continued)

FOREIGN PATENT DOCUMENTS

| | | |
|---|---|---|
| CN | 109313216 A | 2/2019 |
| JP | 2000-353579 A | 12/2000 |

(Continued)

OTHER PUBLICATIONS

TW Office Action dated Jul. 10, 2024 as received in Application No.
111139155.

(Continued)

*Primary Examiner* — Eman A Alkafawi
*Assistant Examiner* — Suresh K Rajaputra
(74) *Attorney, Agent, or Firm* — Maschoff Brennan

(57) ABSTRACT
A test socket is capable of providing heat that is required to
perform burn-in tests without any additional equipment, the
test socket including: a connection portion 120; a frame 110
supporting the connection portion 120; and a heating wire
150 disposed on the frame 110.

15 Claims, 19 Drawing Sheets

100

(56)                    References Cited

U.S. PATENT DOCUMENTS

| | | | |
|---|---|---|---|
| 2009/0002010 A1* | 1/2009 | Wong | G01R 31/2874 |
| | | | 324/750.05 |
| 2013/0285684 A1* | 10/2013 | Okada | G01R 31/2642 |
| | | | 324/750.03 |
| 2015/0309114 A1* | 10/2015 | Barabi | G01R 1/0458 |
| | | | 324/750.03 |
| 2019/0137541 A1 | 5/2019 | Kim | |
| 2020/0060019 A1* | 2/2020 | Tustaniwskyj | H05B 3/20 |
| 2024/0159793 A1* | 5/2024 | Takei | G01R 1/0466 |

FOREIGN PATENT DOCUMENTS

| | | |
|---|---|---|
| KR | 20-0486766 Y1 | 6/2018 |
| KR | 10-2019-0006371 A | 1/2019 |
| KR | 10-2037961 B1 | 10/2019 |
| KR | 10-2020-0144514 A | 12/2020 |
| TW | 200912320 A | 3/2009 |
| WO | 2016/160730 A1 | 10/2016 |

OTHER PUBLICATIONS

KR Office Action dated Aug. 19, 2024 as received in Application No. 10-2022-0049285.

* cited by examiner

100

100

<u>110</u>

TEST SOCKET

TECHNICAL FIELD

The present disclosure relates to a test socket, and in particular to a test socket that may provide heat required to perform burn-in tests without any additional equipment.

BACKGROUND TECHNOLOGY

In general, semiconductor devices may be formed on a silicon wafer, which is used as a semiconductor substrate, by repeatedly performing a series of manufacturing processes, and the semiconductor devices formed as above may be manufactured into semiconductor packages through a dicing process, a bonding process, and a packaging process.

It may be determined that the semiconductor packages manufactured in this way have good or defective quality through characteristic tests. This characteristic tests may include a burn-in test in which high-temperature heat is applied to the semiconductor packages.

Such a burn-in test commonly requires separate external apparatuses, such as a chamber for applying high temperature heat. For this reason, conventional equipment for burn-in tests requires a large space to install external apparatuses, and also requires a large number of parts required for installation of such external apparatuses, which inevitably increases costs.

DETAILED DESCRIPTION OF THE INVENTION

Technical Objectives

The present disclosure is directed to a test socket that may provide heat required to perform burn-in tests without any additional equipment.

Technical Solution to the Problem

In order to achieve the above objectives, according to an embodiment, a test socket 300 includes: a connection portion 120; a frame 110 supporting the connection portion 120; and a heating wire 150 disposed on the frame 110.

The heating wire 150 is disposed on at least one surface of a first surface Su and a second surface Sb of the frame 110.

The first surface Su of the frame 110 is a surface facing a socket guide 140, and the second surface Sb of the frame 110 is a surface opposite to the first surface Su.

At least a portion of the heating wire 150 is disposed between the first surface Su of the frame 110 and the socket guide 140.

At least a portion of the heating wire 150 is disposed between the second surface Sb of the frame 110 and a test device.

The heating wire 150 is connected to an external power supply.

The heating wire 150 is connected to the external power supply 600 through a hole 140H1, 140H2 of the socket guide 140.

The heating wire 150 is printed or deposited onto the frame 110.

The test socket 300 further includes a film 130 disposed on the frame 110, and the heating wire 150 is disposed on the film 130.

The film 130 is disposed on at least one surface of a first surface and a second surface of the frame 110.

The film 130 further includes an extension portion 132 that does not overlap the frame 110, and at least a portion of the heating wire 150 is disposed on the extension portion 132 of the film 130.

The frame includes: a main body having a connection hole; and an extension portion extending from the main body.

A terminal of the heating wire is disposed on the extension portion.

The heating wire 150 surrounds a center of the frame 110 and includes a plurality of heating wires 151, 152, 153 respectively arranged at different distances from the center of the frame 110.

The heating wire 150 includes a plurality of heating wires 151, 152, 153, 154 arranged along different sides of the frame 110, respectively.

The frame 110 includes at least one coupling hole 110H2, and at least a portion of the heating wire 150 has a shape surrounding the coupling hole 110H2.

The frame 110 includes: a plate 812; and a support film 811 disposed on top or bottom of the plate.

The heating wire is disposed on the support film.

The support film is disposed on top of the plate, and the test socket further includes a relay terminal 812T1, 812T2 disposed on the plate and connected to a terminal of the heating wire.

The terminal 150T1, 150T2 and the relay terminal 812T1, 812T2 are different from each other in terms of at least one of shape and size.

The plate includes a main body and an extension portion extending from the main body of the plate, the support film includes a main body and an extension portion extending from the main body of the support film, the main body of the plate and the main body of the support film overlap each other, the extension portion of the plate and the extension portion of the support film overlap each other, the heating wire is disposed on at least one of the main body and the extension portion of any one of the plate and the support film, and a terminal of the heating wire is disposed on the extension portion of any one of the plate and the support film.

The test socket further includes: a relay terminal disposed on the extension portion of the other of the plate and the support film and connected to the terminal of the heating wire.

The frame 710 includes a support film 711; and a plate 712 disposed on the support film.

The connection portion includes an insulating portion and a conductive portion.

The conductive portion includes at least one conductive particle.

The conductive portion includes at least one conductive wire.

The connection portion includes an anisotropic conductive sheet, and the anisotropic conductive sheet includes an insulating portion of an elastic insulating material and a conductive portion including at least one conductive particle.

The connection portion further includes a support sheet on the anisotropic conductive sheet.

Furthermore, to achieve the above technical objectives, according to an embodiment, a test socket 300 includes: a connection portion 120; a frame 110 supporting the connection portion 120; a heating wire 150 disposed on the frame 110; and a socket guide 140 disposed on the frame 110.

At least a portion of the heating wire 150 overlaps the socket guide 140.

At least a portion of the heating wire 150 contacts the socket guide 140.

The heating wire 150 is connected to an external power supply 600 through a hole 140H1, 140H2 of the socket guide 140.

The test socket further includes: a conductive portion 140C1, 140C2 inserted into the hole 140H1, 140H2 of the socket guide 140 and connected to the power supply 600 and the heating wire 150.

The test socket further includes: an insulating portion disposed between the conductive portion 140C1, 140C2 and an inner wall of the hole 140H1, 140H2 of the socket guide 140.

The test socket further includes: a test board 200 on which the connection portion is disposed.

The heating wire 150 is connected to a power supply 600 through the test board 200 connected to the connection portion 120.

The heating wire 150 is connected to the power supply 600 through a conductive pattern 201, 202 of the test board 200.

The frame 110 includes an extension portion 112 extending outside of the socket guide 140 through a gap between the socket guide 140 and the test board 200, and at least a portion of the heating wire 150 is disposed on the extension portion 112 of the frame 110.

The heating wire 150 is connected to a power supply 600 outside the socket guide 140.

Effects of the Invention

The test socket according to the present disclosure may provide the following effects.

First, since a heating wire is disposed on a frame of the test socket, a separate external apparatus such as a chamber is not necessary to provide the heat required for burn-in tests. Accordingly, the equipment required for burn-in tests may be simplified, so there are no space restrictions and costs may be reduced.

Second, since a heat source (e.g., a heating wire) is disposed close to a device under test, heat loss may be reduced and rapid heat transfer may be achieved, thereby shortening the burn-in test time.

Third, since a plurality of heating wires are arranged along each side of the frame to generate heat selectively, it is possible to perform a partial characteristic test of the device under test.

Fourth, since a portion of the heating wire forms a ring shape surrounding coupling holes of the frame, the coupling holes of the frame may be easily recognized. Accordingly, a coupling process between the frame and a socket guide may be performed more smoothly.

Fifth, since it has a structure in which a heating wire terminal, a relay terminal, and a power terminal are arranged in a row and directly contact each other to receive power, excellent characteristics in terms of manufacturing-related aspects (e.g., manufacturing method and manufacturing cost, etc.) and thermal efficiency may be achieved.

Meanwhile, the effects that may be obtained from the present disclosure are not limited to the effects described above, and other effects not described above will be clearly understood by those skilled in the art from the description below.

4

MODES FOR IMPLEMENTATION OF THE INVENTION

Figure 1:
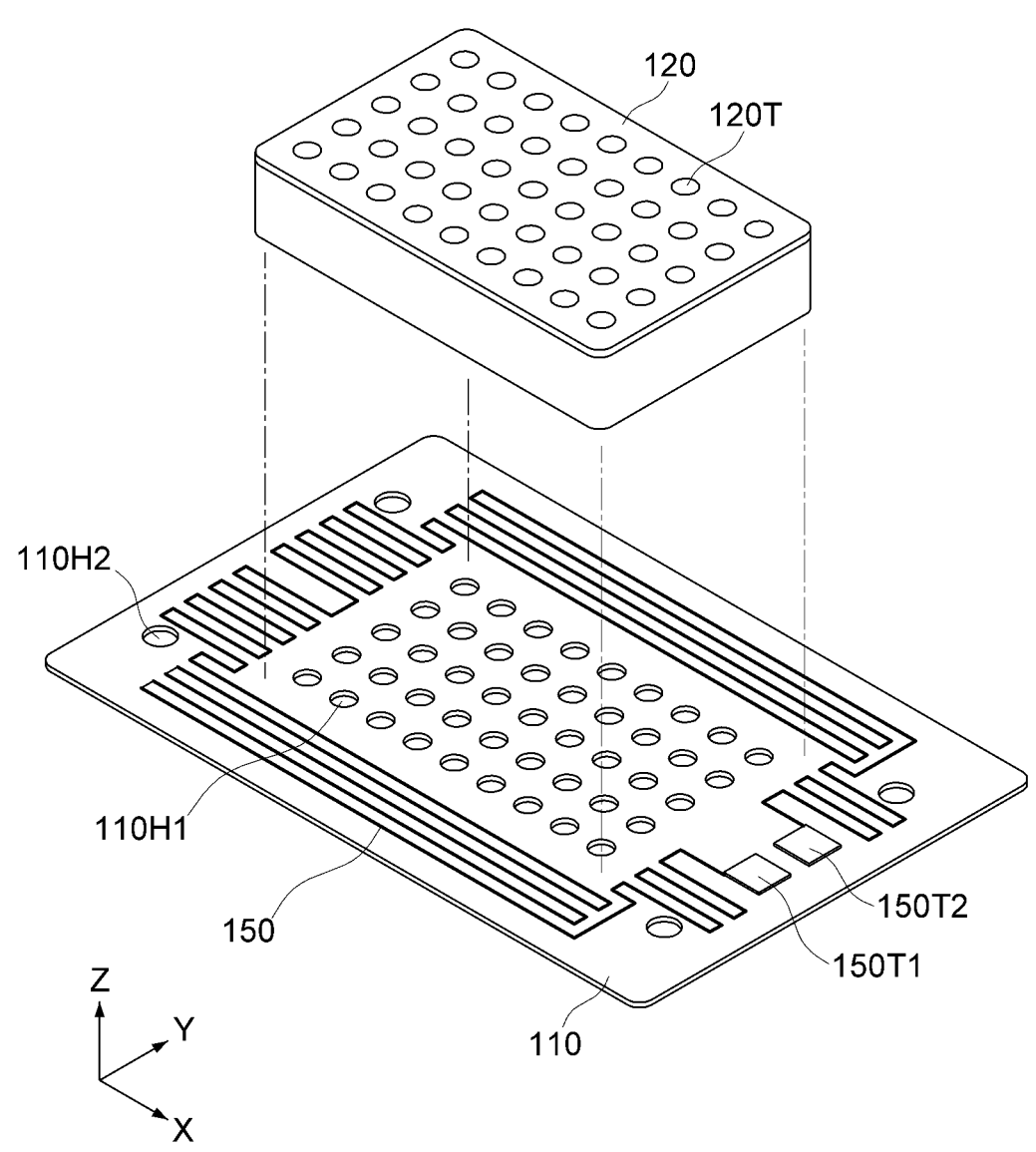
FIG. 1 is an exploded three-dimensional view illustrating a test socket according to an embodiment of the present disclosure.

In the drawings, thicknesses of a plurality of layers and areas are illustrated in an enlarged manner for clarity and ease of description thereof. When a layer, area, element, or plate is referred to as being "on" another layer, area, element, or plate, it may be directly on the other layer, area, element, or plate, or intervening layers, areas, elements, or plates may be present therebetween. Conversely, when a layer, area, element, or plate is referred to as being "directly on" another layer, area, element, or plate, no intervening layers, areas, elements, or plates may be present. Further, when a layer, area, element, or plate is referred to as being "below" another layer, area, element, or plate, it may be directly below the other layer, area, element, or plate, or intervening layers, areas, elements, or plates may be present therebetween. Conversely, when a layer, area, element, or plate is referred to as being "directly below" another layer, area, element, or plate, no intervening layers, areas, elements, or plates may be present.

The spatially relative terms "below", "beneath", "lower", "above", "upper" and the like, may be used herein for ease of description to describe the relations between one element and another element as illustrated in the drawings. It will be understood that the spatially relative terms are intended to encompass different orientations of the device in use or operation, in addition to the orientation illustrated in the drawings. For example, in a case where a device illustrated in the drawing is turned over, the device positioned "below" or "beneath" another device may be disposed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or groups, but do not preclude the presence or addition of one or more other features, integers, steps, operations, elements, and/or groups.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a test socket 100 according to an embodiment of the present disclosure will be described in detail with reference to FIGS. 1 to 25.

Figure 2:
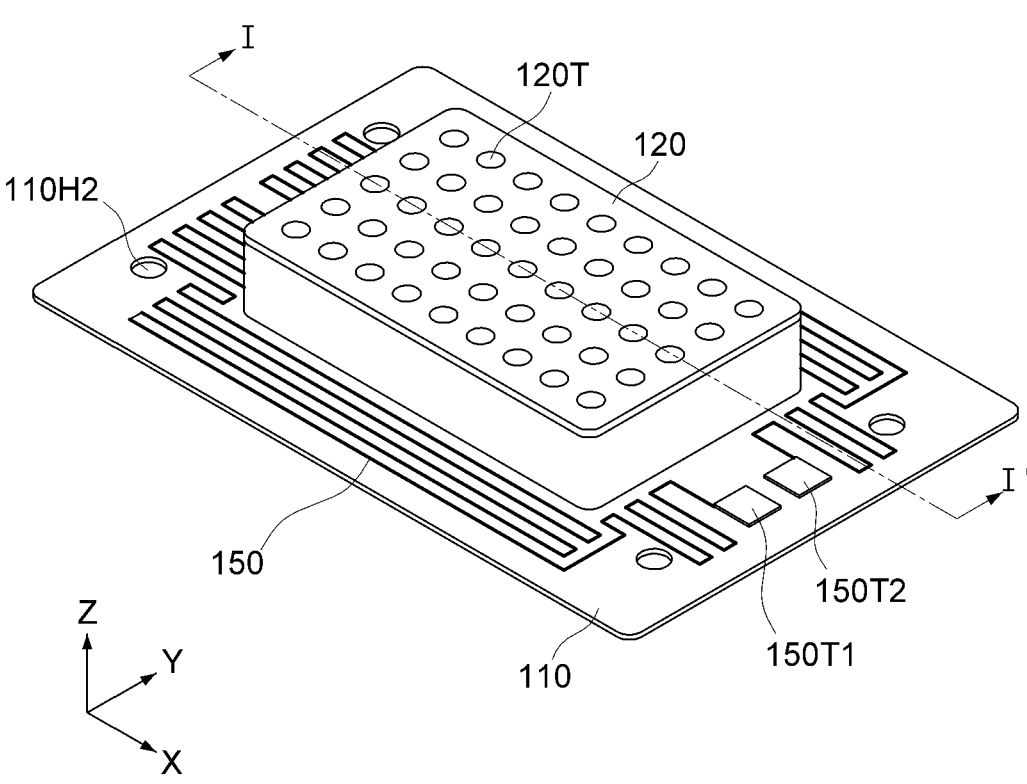
FIG. 2 is a three-dimensional view illustrating the combined test socket of FIG. 1.
Figure 3:
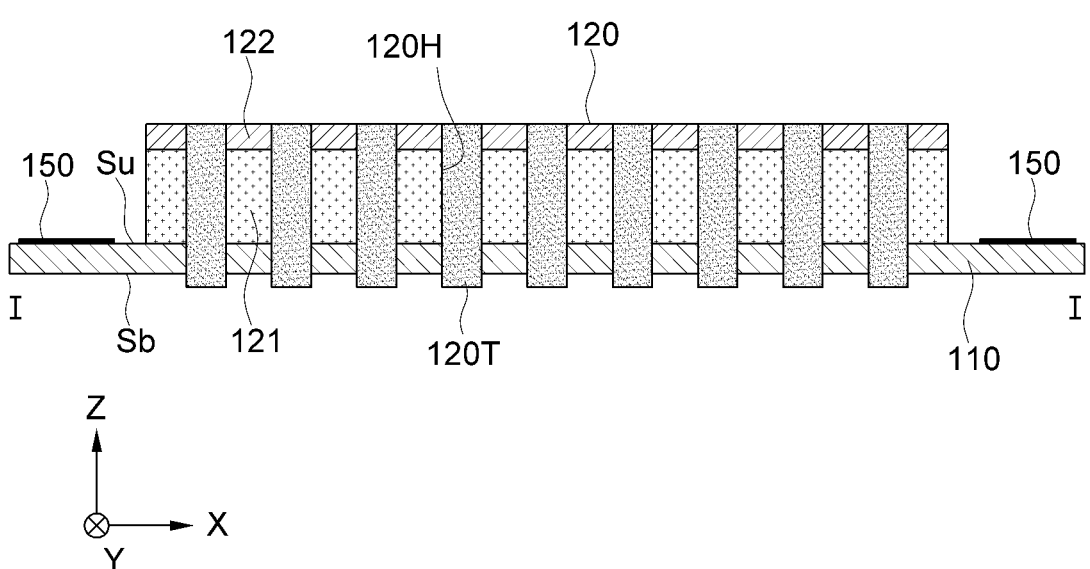
FIG. 3 is a cross-sectional view taken along the line I-I' of FIG. 2.

FIG. 1 is an exploded three-dimensional view illustrating a test socket 100 according to an embodiment of the present disclosure, FIG. 2 is a three-dimensional view illustrating the combined test socket 100 of FIG. 1, and FIG. 3 is a cross-sectional view taken along the line I-I' of FIG. 2.

The test socket 100 according to an embodiment of the present disclosure may be used to electrically connect a device terminal (e.g., 400T in FIG. 11) of a device under test (e.g., a device to be tested) (e.g., 400 in FIG. 11) and a pad terminal (e.g., 200T in FIG. 11) of a test board (e.g., 200 in FIG. 11) to each other between the device under test 400 and the test board 200.

For example, the test socket 100 may be used for a final electrical test of a semiconductor device in a post-process during a manufacturing process of the semiconductor device, but an example in which the test socket 100 according to an embodiment of the present disclosure is applicable is not limited thereto.

The test socket 100 according to an embodiment of the present disclosure may be removably (or detachably) mounted on the test board 200. The test socket 100 aligns the device under test 400, which is transported to the test board 200 by hand or by a transport apparatus, on the test board 200, and when the device under test 400 is tested (e.g., inspected), the test socket 100 may contact the test board 200 and the device under test 400 in a vertical direction (e.g., an up and down direction), and electrically connect the test board 200 and the device under test 400 to each other.

The device under test 400 described above may be, for example, a semiconductor device in which a semiconductor IC (Integrated Circuit) chip and a plurality of terminals are packaged in a hexahedral shape using a resin material. For example, the device under test 400 may be a semiconductor device used in a mobile communication device, but embodiments are not limited thereto. The device under test 400 may include a plurality of hemispherical device terminals (e.g., 400T in FIG. 11) on its lower side. The plurality of device terminals 400T of the device under test 400 may include, for example, a signal device terminal and a ground device terminal.

The test board 200 may test various operating characteristics of the device under test 400. The test board 200 may include a plurality of pad terminals 200T that are electrically connected to a terminal of the device under test 400 through a connection portion 120. The pad terminals 200T of the test board 200 described above may include, for example, a signal pad terminal configured to transmit a test signal and receive a response signal, and a ground pad terminal disposed around the signal pad terminal.

The signal device terminal of the device under test 400 may be electrically connected to the signal pad terminal of the test board 200 through the connection portion 120, and the ground device terminal of the device under test 400 may be electrically connected to the ground pad terminal of the test board 200 through the connection portion 120. When the device under test 400 is tested, the connection portion 120 may electrically connect each device terminal 400T of the device under test 400 and each pad terminal 200T of the test board 200 corresponding thereto in the vertical direction (e.g., in a Z-axis direction and in a direction opposite to the Z-axis (hereinafter, "−Z-axis direction"), and the device under test 400 may be tested by the test board 200 through the connection portion 120. For example, the connection portion 120 may be disposed between the device under test 400 and the test board 200 for a high-frequency RF (Radio Frequency) test of the device under test 400.

Hereinafter, throughout the specification, the term "vertical direction" refers to a direction in which the device under test 400 and the test board 200 face each other. In addition, the directional term "vertical direction" includes an upward direction and a downward direction, but does not mean a specific one of the upward direction and the downward direction.

The test socket 100 according to an embodiment of the present disclosure may include a frame 110 and a connection portion 120 arranged along the Z-axis direction, as an example illustrated in FIGS. 1 to 3.

The frame 110 may support the connection portion 120. The frame 110 may include, for example, polyimide or stainless steel. Furthermore, the frame 110 may include, for example, a composite material such as fiber glass made of woven fabric and a flame-resistant epoxy resin binder.

The frame 110 may include at least one connection hole 110H1, at least one coupling hole 110H2, and at least one heating wire 150 (or a heating cable).

The connection holes 110H1 may be disposed, for example, at a center portion of the frame 110. The connection holes 110H1 may penetrate the center portion of the frame 110. The connection holes 110H1 may be arranged in a matrix form along an X-axis direction and a Y-axis direction at the center portion of the frame 110, as an example illustrated in FIG. 1.

The coupling holes 110H2 may be disposed at, for example, an edge of the frame 110. The coupling holes 110H2 may be used to couple the frame 110 and a socket guide (e.g., 140 in FIG. 11) to be described below. For example, each of coupling pins protruding from the socket guide 140 may be inserted into each of the corresponding coupling holes 110H2, respectively, such that the frame 110 and the socket guide 140 may be coupled to each other. In an embodiment, the coupling pins of the socket guide 140 may penetrate through the coupling holes 110H2 and be inserted into coupling recesses of the test board 200.

The heating wire 150 is configured to, for example, provide heat required for burn-in tests of the device under test 400, and the heating wire 150 may be disposed on the frame 110. For example, as illustrated in FIG. 3, when defining a surface facing (or in contact with) the test board 200 among the plurality of surfaces of the frame 110 is defined as a lower surface Sb of the frame 110, and a surface disposed opposite to the lower surface Sb as an upper surface Su of the frame 110, the heating wire 150 may be disposed on the upper surface Su of the frame 110 (e.g., an edge of the upper surface Su of the frame 110). In an embodiment, the heating wire 150 may be disposed on the lower surface Sb of the frame 110 (e.g., an edge of the lower surface Sb of the frame 110), instead of the upper surface Su of the frame 110. In an embodiment, the heating wire 150 may be disposed on both the upper surface Su and the lower surface Sb of the frame 110.

The heating wire 150 may be disposed along an edge of at least one of the upper surface Su and the lower surface Sb to surround the connection holes 110H1 of the frame 110.

When the heating wire 150 is disposed on the upper surface Su of the frame 110, the heating wire 150 may contact the upper surface Su of the frame 110, and when the heating wire 150 is disposed on the lower surface Sb of the frame 110, the heating wire 150 may contact the lower surface Sb of the frame 110.

The heating wire 150 may receive power (e.g., voltage) from an external power supply (e.g., 600 in FIG. 12) to generate heat. To this end, as an example, a first terminal 150T1 of the heating wire 150 may be connected to a positive polarity terminal of the power supply 600, and a second terminal 150T2 of the heating wire 150 may be connected to a negative polarity terminal of the power supply 600. Herein, the power supply 600 may output a positive voltage through the positive polarity terminal and output a negative voltage (or a ground voltage) through the negative polarity terminal.

The heating wire 150 may be formed on at least one surface of the frame 110 (e.g., at least one of the upper surface Su and the lower surface Sb of the frame 110 described above) in a printing method or a deposition method. In other words, the heating wire 150 may be attached onto the frame 110 by being printed or deposited on at least one surface of the frame 110.

The heating wire 150 may include a material with excellent thermal and electrical conductivity. For example, the heating wire 150 may include any one of copper (Cu), nickel (Ni), and chromium (Cr), or may also include at least two of the above-mentioned copper, nickel, and chromium materials.

A remaining portion of the heating wire 150 except for the first terminal 150T1 and the second terminal 150T2 may be insulated with, for example, an insulating material. To this end, as an example, the remaining portion of the heating wire 150 except for the first terminal 150T1 and the second terminal 150T2 may be surrounded by an insulating material.

As illustrated in FIG. 3, the connection portion 120 may include at least one insulating layer (e.g., a first insulating layer 121 and a second insulating layer 122) and at least one signal conductive portion 120T. Herein, the first insulating layer 121 and the second insulating layer 122 may be stacked along the Z-axis direction. As an example illustrated in FIG. 3, the plurality of signal conductive portions 120T may be respectively disposed in the plurality of through holes 120H that penetrate both the first insulating layer 121 and the second insulating layer 122.

The signal conductive portion 120T may include at least one conductive particle. The conductive particles may be particles made of a highly conductive metal material. For example, the highly conductive metal material may be a metal, but embodiments are not limited thereto. Alternatively, the conductive particles may have a shape in which a core particle made of an elastic resin material or a metal material is coated with the above-described highly conductive metal material.

Specific examples of the conductive particles may include magnetic metal particles such as iron (Fe), nickel (Ni), and cobalt (Co); particles including the metal or alloys thereof; conductive particles in which the particles are included as core particles with a metal having good conductivity such as gold, silver, palladium, rhodium, etc., plated on a surface of the core particles; conductive particles in which inorganic particles such as non-magnetic metal particles or glass beads, or polymer particles are included as core particles with a conductive magnetic material such as nickel or cobalt plated on a surface of the core particles; or the core particles coated with both a conductive magnetic material and a metal with good conductivity.

In another embodiment, the signal conductive portion 120T described above may include at least one conductive wire.

In an embodiment, in the connection portion 120, the plurality of signal conductive portions 120T described above may be formed without the through hole 120H according to its manufacturing method. For example, a liquid material in which liquid silicone is mixed with conductive particles is injected into a mold, and then a sheet connector including an upper insulating layer (e.g., a polyimide film) and conductive particles is coupled onto the mold (the conductive particles of this sheet connector are filled in through holes of the upper insulating layer), and then a magnetic field is applied to the structure in which the mold and the sheet connector are coupled such that a lower insulating layer and a conductive portion are formed in a lower portion of the structure, and a conductive portion is gathered together in the through holes of the sheet connector in an upper portion of the structure. A test socket (e.g., a rubber socket) manufactured in such a way may include a conductive portion made of conductive particles on the lower side of the structure without a through hole penetrating a silicone rubber.

Alternatively, a test socket may be manufactured by coupling a cured silicone rubber and a polyimide film, then defining a through hole therethrough, pushing a liquid conductive material into it, and then curing it.

Alternatively, unlike this, a test socket may be manufactured by separately making only a conductive portion (e.g., a rubber pin) in an external mold from the beginning, and then inserting the above-described rubber pin into through holes of the above-described silicon-polyimide bonding sheet.

In the connection portion 120, the signal conductive portion 120T may transmit signals in the vertical direction between the test board 200 and the device under test 400. The signal conductive portion 120T may have a cylindrical shape extending in the vertical direction.

The signal conductive portion 120T may contact the device terminal 400T of the device under test 400 at its upper end and may contact the pad terminal 200T of the test board 200 at its lower end. Accordingly, a conductive path in the vertical direction may be formed between the pad terminal 200T and the device terminal 400T corresponding to one signal conductive portion 120T via the signal conductive portion 120T. A test signal of the test board 200 may be transmitted from the pad terminal 200T to the device terminal 400T of the device under test 400 through the signal conductive portion 120T, and a response signal of the device under test 400 may be transmitted from the device terminal 400T to the pad terminal 200T of the test board 200 through the signal conductive portion 120T.

Figure 4:
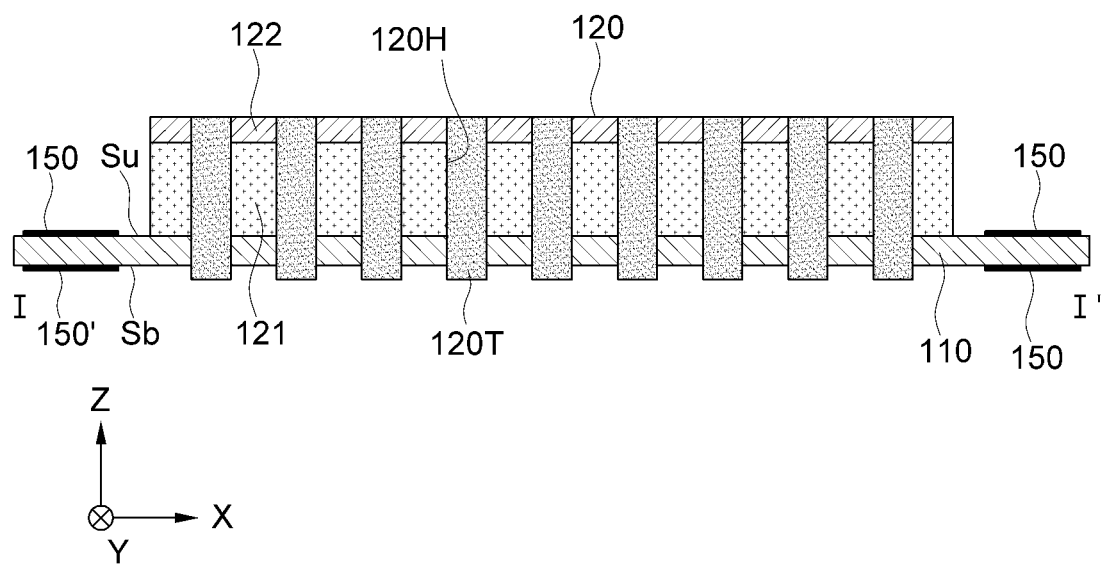
FIG. 4 is a cross-sectional view illustrating a test socket according to another embodiment of the present disclosure.

FIG. 4 is a cross-sectional view illustrating a test socket 100 according to another embodiment of the present disclosure.

As illustrated in FIG. 4, heating wires 150 and 150' may be disposed on an upper surface Su and a lower surface Sb of a frame 110, respectively. For example, an upper heating wire 150 may be disposed on the upper surface Su of the frame 110, and a lower heating wire 150' may be disposed on the lower surface Sb of the frame 110. In an embodiment, the upper heating wire 150 may be disposed at an edge of the upper surface Su of the frame 110, and the lower heating wire 150' may be disposed at an edge of the lower surface Sb of the frame 110.

In such an embodiment, the upper heating wire 150 and the lower heating wire 150' may have the same shape as each other or different shapes from each other. Furthermore, the upper heating wire 150 and the lower heating wire 150' may have the same thickness as each other or different thicknesses from each other. In such a case, the thickness of the upper heating wire 150 and the thickness of the lower heating wire 150' refer to a size in the Z-axis direction. Furthermore, the upper heating wire 150 and the lower heating wire 150' may be disposed to overlap each other. For example, the upper heating wire 150 and the lower heating wire 150' may overlap each other along the Z-axis direction.

Since the upper heating wire 150 and the lower heating wire 150' are substantially the same as the heating wire 150 of FIGS. 1 to 3 described above, the description of the upper heating wire 150 and the lower heating wire 150' will refer to the related description in FIGS. 1 to 3.

Figure 5:
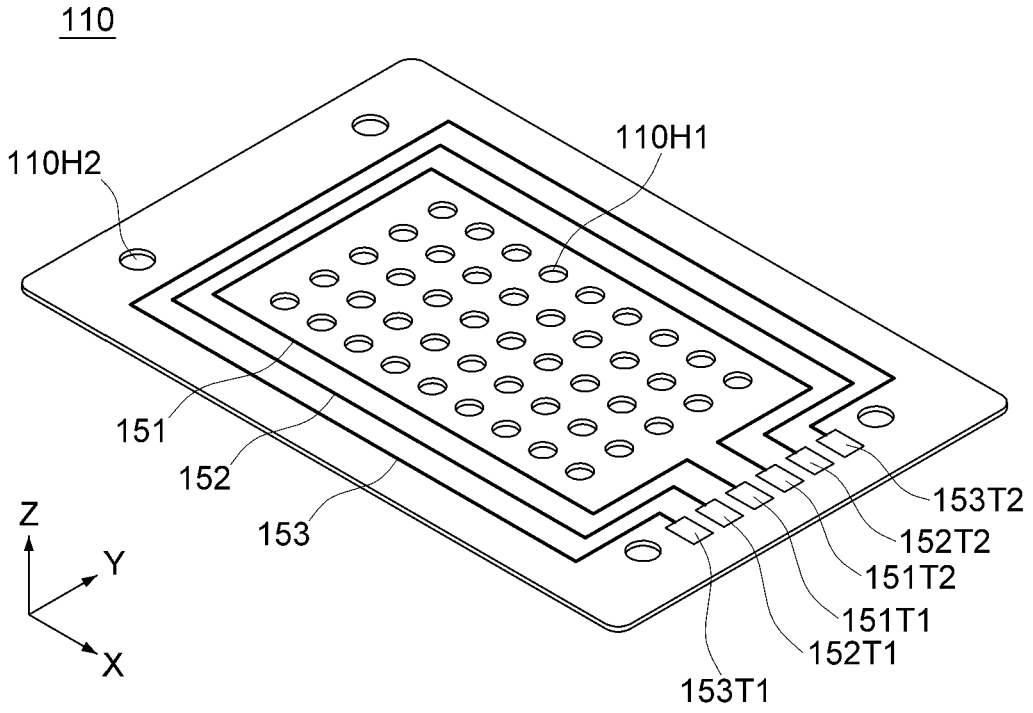
FIG. 5 is a three-dimensional view illustrating a frame of a test socket according to another embodiment of the present disclosure.

FIG. 5 is a three-dimensional view illustrating a frame 110 of a test socket 100 according to another embodiment of the present disclosure.

As illustrated in FIG. 5, a plurality of heating wires 151, 152, and 153 may surround (e.g., enclose) a center of the frame 110 and be arranged at different distances from the center of the frame 110. For example, the first heating wire 151, the second heating wire 152, and the third heating wire 153 may each have a ring shape (e.g., a partially broken ring shape) surrounding the center of the frame 110, and among the first to third heating wires 151, 152, and 153, the first heating wire 151 may be disposed closest to the center of the frame 110, the third heating wire 153 may be disposed farthest from the center of the frame 110, and the second heating wire 152 may be disposed between the first heating wire 151 and the second heating wire 152. In other words, the second heating wire 152 may be disposed more away from the center of the frame 110 than the first heating wire 151 is therefrom, and closer to the center of the frame 110 than the third heating wire 153 is thereto.

The first to third heating wires 151, 152, and 153 are separate heating wires, and for example, the first heating wire 151 may receive a first power from a first power supply, the second heating wire 152 may receive a second power from a second power supply, and the third heating wire 153 may receive a third power from a third power supply. To this end, in an embodiment, a first terminal 151T1 and a second terminal 151T2 of the first heating wire 151 may be connected to the first power supply, a first terminal 152T1 and a second terminal 152T2 of the second heating wire 152 may be connected to the second power supply, and a first terminal 153T1 and a second terminal 153T2 of the third heating wire 153 may be connected to the third power supply.

The first power, the second power, and the third power may be voltages of the same level, or alternatively, at least two of the first power, the second power, and the third power may be voltages of different levels. In an embodiment, when the first power, the second power, and the third power each have voltage of the same level, the first heating wire 151 having a shortest length among the first to third heating wires 151, 152, and 153 may generate a lowest heat, the third heating wire 153 having a longest length may generate a highest heat, and the second heating wire 152 longer than the first heating wire 151 and shorter than the third heating wire 153 may generate heat higher than the heat generated by the first heating wire 151 and lower than the heat generated by the third heating wire 153.

According to a configuration of FIG. 5, by selectively supplying a power to the plurality of heating wires 150, a temperature of heat provided to the device under test 400 may be easily controlled. For example, only the first heating wire 151 among the first to third heating wires 151, 152, and 153 may be selectively supplied with the first power (in such an embodiment, the remaining heating wires except for the selected first heating wire 151 are not supplied with the power), such that a heat of a lowest temperature may be supplied to the device under test 400, or only the first and second heating wires 151 and 152 among the first to third heating wires 151, 152, and 153 may be selectively supplied with the first power and the second power (in such an embodiment, the remaining heating wires except for the selected first and second heating wires 151 and 152 are not supplied with the power), such that a heat of an intermediate-level temperature may be supplied to the device under test 400. In an embodiment, all of the first to third heating wires 151, 152, and 153 may be supplied with the first to third power, such that a heat of a highest temperature may be supplied to the device under test 400. As another example, only the third heating wire 153 among the first to third heating wires 151, 152, and 153 may be selectively supplied with the third power (in such an embodiment, the remaining heating wires except for the selected third heating wire 153 are not supplied with the power), and as another example, only the second heating wire 152 among the first to third heating wires 151, 152, and 153 may be selectively supplied with the second power (in such an embodiment, the remaining heating wires except for the selected second heating wire 152 are not supplied with the power).

In an embodiment, each of the first to third heating wires 151, 152, and 153 may include at least one curved portion. For example, similar to the heating wire 150 of FIG. 1 described above, each of the first to third heating wires 151, 152, and 153 may surround the center of the frame 110 while having a plurality of curved portions.

In an embodiment, the first to third heating wires 151, 152, and 153 may be formed by printing or deposition on at least one surface of the frame 110 (e.g., at least one of the upper surface Su and the lower surface Sb of the frame 110 described above). In other words, the first to third heating wires 151, 152, and 153 may be attached onto the frame 110 by being printed or deposited on at least one surface of the frame 110.

The first to third heating wires 151, 152, and 153 may include a conductive material with high thermal and electrical conductivity. For example, the first to third heating wires 151, 152, and 153 may include any one of copper, nickel, and chromium, or may include at least two of the above-mentioned copper, nickel, and chromium.

The remaining portions of the first to third heating wires 151, 152, and 153, except for each first terminal 151T1, 152T1, and 153T1 and each second terminal 151T2, 152T2, and 153T2, may be insulated with, for example, an insulating material. To this end, as an example, the remaining portions of the first to third heating wires 151, 152, and 153 except for the first terminals 151T1, 152T1, and 153T1 and the second terminals 151T2, 152T2, and 153T2 may be surrounded with an insulating material.

Figure 6:
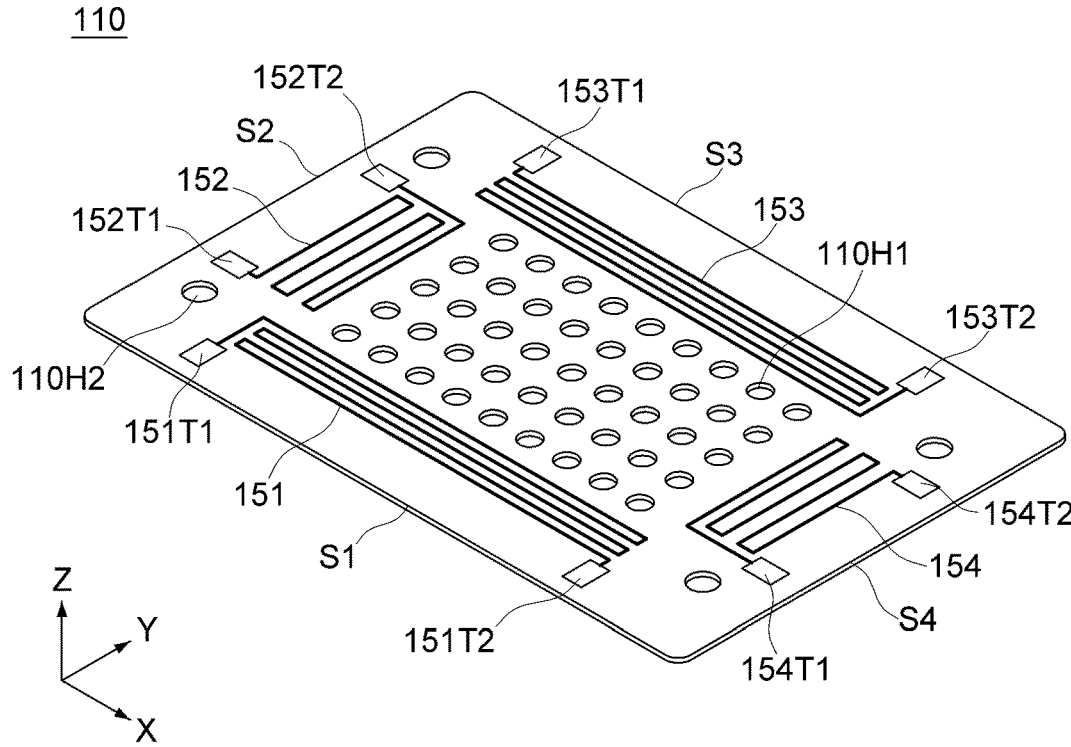
FIG. 6 is a three-dimensional view illustrating a frame of a test socket according to another embodiment of the present disclosure.

FIG. 6 is a three-dimensional view illustrating a frame 110 of a test socket 100 according to another embodiment of the present disclosure.

As illustrated in FIG. 6, a plurality of heating wires 151, 152, 153, and 154 may be disposed along different sides of the frame 110, respectively. As in an example illustrated in FIG. 6, the first heating wire 151 may be disposed along a first side S1 of the frame 110, the second heating wire 152 may be disposed along a second side S2 of the frame 110, the third heating wire 153 may be disposed along a third side S3 of the frame 110, and the fourth heating wire 150 may be disposed along a fourth side S4 of the frame 110.

The first to fourth heating wires 151, 152, 153, and 154 are separate heating wires, and for example, the first heating wire 151 may receive a first power from a first power supply, the second heating wire 152 may receive a second power from a second power supply, the third heating wire 153 may receive a third power from a third power supply, and the fourth heating wire 154 may receive a third power from a fourth power supply. The first power, the second power, the third power, and the fourth power may be voltages of the same level, or alternatively, at least two of the first power, the second power, the third power, and the fourth power may be voltages of different levels.

According to a configuration of FIG. 6, by selectively supplying power to at least one of the plurality of heating wires 151, 152, 153, and 154, a heat of a higher or lower temperature may be supplied to a specific portion of the device under test 400, as compared to another portion of the device under test 400. For example, when the first power is selectively supplied only to the first heating wire 151 among the first to fourth heating wires 151, 152, 153, and 154 (in such an embodiment, the remaining heating wires except for the selected first heating wire 151 are not supplied with the power), a portion of the device under test 400 adjacent to the first heating wire 151 may receive more heat than other portions of the device under test 400. In other words, the portion of the device under test 400 that is close to the first side S1 of the frame 110 where the first heating wire 151 is disposed may receive more heat than other portions. Accordingly, the configuration according to FIG. 6 may be effectively applied when partial characteristic test of the device under test 400 is required. In an embodiment, according to the embodiment of FIG. 6, it is also possible to selectively supply power to two or three heating wires of the plurality of heating wires 151, 152, 153, and 154, and in contrast, it is also possible to supply power to all heating wires 151, 152, 153 and 154.

In an embodiment, the first to fourth heating wires 151, 152, 153, and 154 may be formed by printing or deposition on at least one surface of the frame 110 (e.g., at least one of the upper surface Su and the lower surface Sb of the frame 110 described above). In other words, the first to fourth heating wires 151, 152, 153, and 154 may be attached onto the frame 110 by being printed or deposited on at least one surface of the frame 110.

The first to fourth heating wires 151, 152, 153, and 154 may include a conductive material having high thermal and electrical conductivity. For example, the first to fourth heating wires 151, 152, 153, and 154 may include any one of copper, nickel, and chromium, or may include at least two of the above-mentioned copper, nickel, and chromium.

The remaining portions of the first to fourth heating wires 151, 152, 153, and 154, except for each first terminal 151T1, 152T1, 153T1, and 154T1 and each second terminal 151T2, 152T2, 153T2, and 154T2, may be insulated with, for example, an insulating material. To this end, as an example, the remaining portions of the first to fourth heating wires 151, 152, 153, and 154 except for the first terminals 151T1, 152T1, 153T1, and 154T1 and the second terminals 151T2, 152T2, 153T2, and 154T2 may be surrounded with an insulating material.

Figure 7:
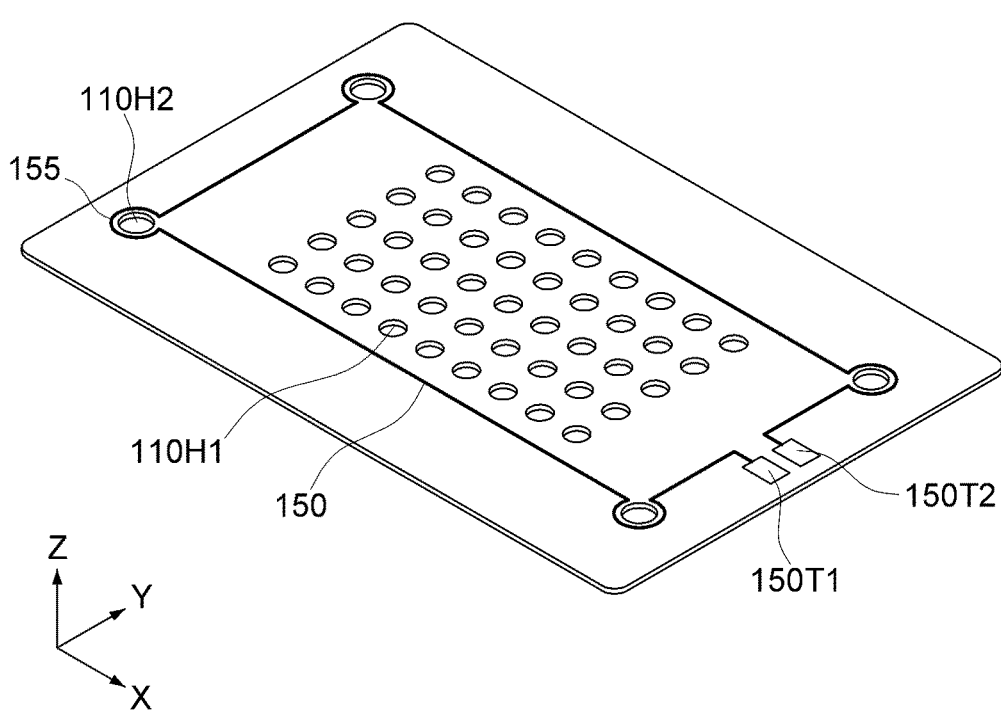
FIG. 7 is a three-dimensional view illustrating a frame of a test socket according to another embodiment of the present disclosure.

FIG. 7 is a three-dimensional view illustrating a frame 110 of a test socket 100 according to another embodiment of the present disclosure.

As illustrated in FIG. 7, at least a portion of a heating wire 150 may have a ring shape (e.g., a partially broken ring shape) surrounding at least one coupling hole 110H2 of the frame 110. As in the example illustrated in FIG. 7, the heating wire 150 may include four guide portions 155 that surround each of the four coupling holes 110H2, respectively.

As such, since each guide portion 155 of the heating wire 150 forms a ring shape surrounding each coupling hole 110H2, the coupling holes 110H2 of the frame 110 may be easily recognized. Accordingly, the coupling process between the frame 110 and the socket guide 140 may be performed more smoothly.

In an embodiment, the guide portion 155 of the heating wire 150 may have the same shape as the coupling hole 110H2 which is surrounded by it. For example, when the coupling hole 110H2 of the frame 110 has a circular shape, the guide portion 155 of the heating wire 150 may also have a circular shape. As another example, when the coupling hole 110H2 of the frame 110 has a quadrangular shape, the guide portion 155 of the heating wire 150 may have a quadrangular shape.

In an embodiment, the heating wire 150 may be formed by printing or deposition on at least one surface of the frame 110 (e.g., at least one of the upper surface Su and the lower surface Sb of the frame 110 described above). In other words, the heating wire 150 may be attached onto the frame 110 by being printed or deposited on at least one surface of the frame 110.

The heating wire 150 may include a conductive material having high thermal and electrical conductivity. For example, the heating wire 150 may include any one of copper, nickel, and chromium, or may include at least two of the above-mentioned copper, nickel, and chromium.

The remaining portions of the heating wire 150, except for a first terminal 150T1 and a second terminal 150T2, may be insulated with, for example, an insulating material. To this end, as an example, the remaining portions of the heating wire 150 except for the first terminal 150T1 and the second terminal 150T2 may be surrounded with an insulating material.

Figure 8:
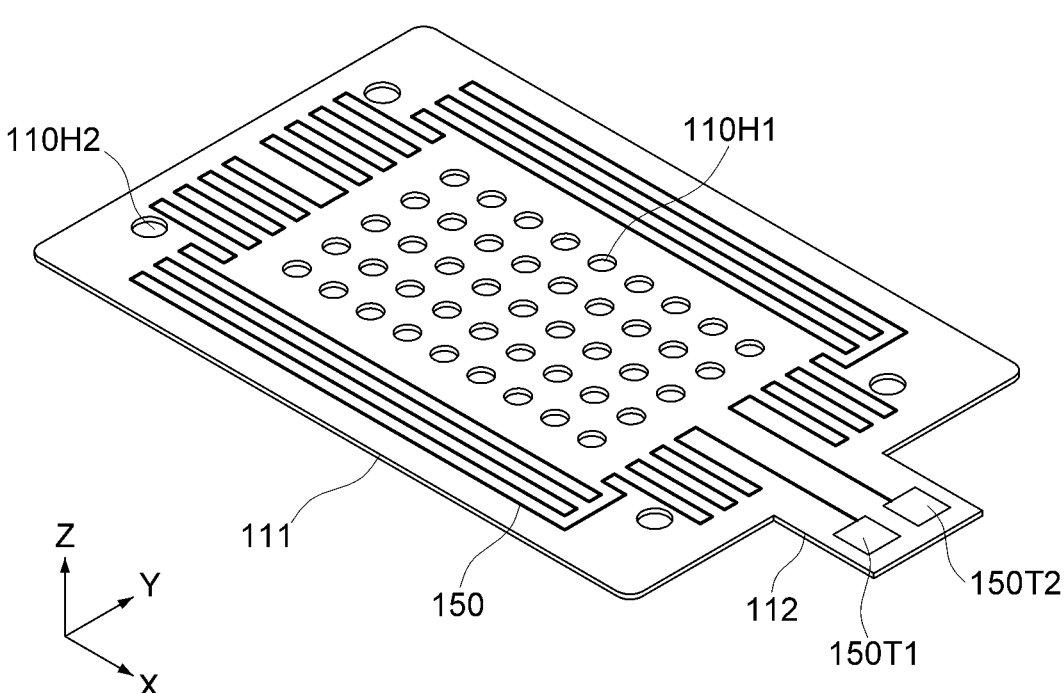
FIG. 8 is a three-dimensional view illustrating a frame of a test socket according to another embodiment of the present disclosure.

FIG. 8 is a three-dimensional view illustrating a frame 110 of a test socket 100 according to another embodiment of the present disclosure.

As illustrated in FIG. 8, the frame 110 may further include an extension portion 112. For example, the frame 110 may include a main body 111 having connection holes 110H1 and an extension portion 112 extending from the main body 111 in an X-axis direction. A first terminal 150T1 and a second terminal 150T2 of a heating wire 150 may be disposed on the extension portion 112 of the frame 110.

In an embodiment, the heating wire 150 of FIG. 8 may be formed by printing or deposition on at least one surface of the frame 110 (e.g., at least one of the upper surface Su and the lower surface Sb of the frame 110 described above). In other words, the heating wire 150 may be attached onto the frame 110 by being printed or deposited on at least one surface of the frame 110.

The heating wire 150 may include a conductive material having high thermal and electrical conductivity. For example, the heating wire 150 may include any one of copper, nickel, and chromium, or may include at least two of the above-mentioned copper, nickel, and chromium.

The remaining portions of the heating wire 150, except for a first terminal 150T1 and a second terminal 150T2, may be insulated with, for example, an insulating material. To this end, as an example, the remaining portions of the heating wire 150 except for the first terminal 150T1 and the second terminal 150T2 may be surrounded with an insulating material.

In an embodiment, the heating wire 150 of FIG. 8 may have any one shape among the shapes of the first to third heating wires 151, 152, and 153 of FIG. 5, the first to fourth heating wires 151, 152, 153, and 154 of FIG. 6, and the heating wire 150 of FIG. 7.

Figure 9:
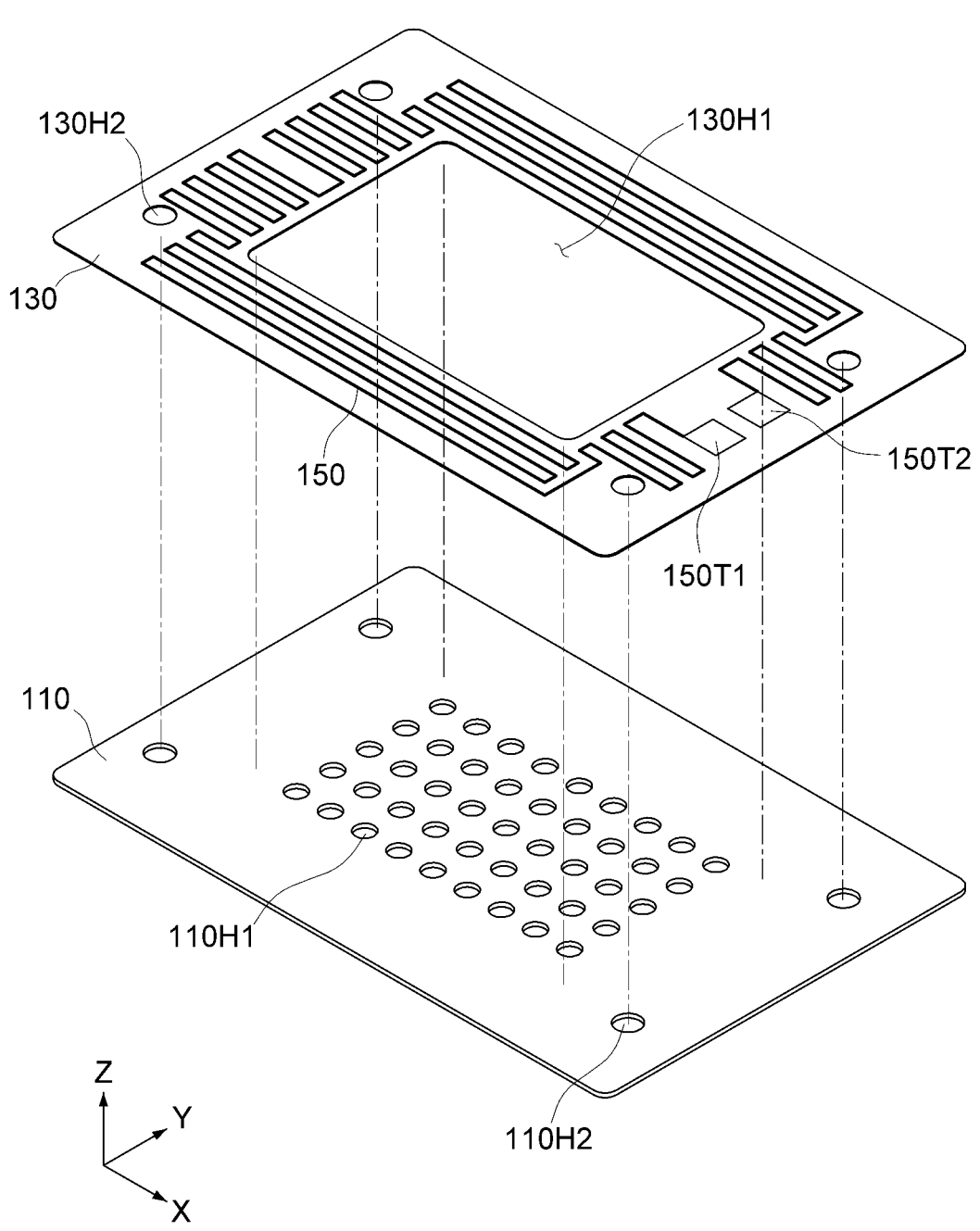
FIG. 9 is a three-dimensional view illustrating a frame and a film of a test socket according to another embodiment of the present disclosure.

FIG. 9 is a three-dimensional view illustrating a frame 110 and a film of a test socket 100 according to another embodiment of the present disclosure.

As illustrated in FIG. 9, a heating wire 150 may be disposed in a separate film 130. For example, the test socket 100 according to another embodiment of the present disclosure may include a film 130 (hereinafter, a "heating film") provided with the heating wire 150. In such a case, the remaining portion of the heating wire 150 except for a first terminal 150T1 and a second terminal 150T2 may be surrounded by the heating film 130.

The heating film 130 may be disposed on the frame 110. As a specific example, the heating film 130 may be disposed on at least one of an upper surface Su and a lower surface Sb of the frame 110, and in FIG. 9, as an example, it is illustrated that the heating film 130 is disposed on the upper surface Su of the frame 110. When the heating film 130 is disposed on the upper surface Su of the frame 110, the heating film 130 may contact the upper surface Su of the frame 110, and when the heating film 130) is disposed on the lower surface Sb of the frame 110, the heating film 130 may contact the lower surface Sb of the frame 110.

With respect to the example in FIG. 9, when a surface facing (or in contact with) the frame 110 among the plurality of surfaces of the heating film 130 is defined as a lower surface of the heating film 130, and a surface disposed opposite to the lower surface is defined as an upper surface of the heating film 130, the heating wire 150 may be disposed on the upper surface of the heating film 130. However, the heating wire 150 may be disposed on the lower surface of the heating film 130 or may be disposed inside the heating film 130. In other words, the heating wire 150 may be disposed on at least one of the upper surface, lower surface, and interior of the heating film 130.

When the heating wire 150 is disposed on the upper or lower surface of the heating film 130, the remaining portion of the heating wire 150 except for a first terminal 150T1 and a second terminal 150T2 may be insulated with, for example, an insulating material. To this end, as an example, the remaining portion of the heating wire 150 except for the first terminal 150T1 and the second terminal 150T2 may be surrounded by an insulating material. In an embodiment, when the heating wire 150 is disposed in the heating film 130, only the portion except for the first terminal 150T1 and the second terminal 150T2 of the heating wire 150 may be disposed in the heating film 130. In other words, the first terminal 150T1 and the second terminal 150T2 of the heating wire 150 may be exposed to the outside of the heating film 130.

In an embodiment, the heating film 130 may further include a connection hole 130H1 and at least one coupling hole 130H2. The connection hole 130H1 may be disposed at a center portion of the heating film 130, and the coupling hole 130H2 may be disposed at an edge of the heating film 130.

In a plan view, the connection hole 130H1 of the heating film 130 surround connection holes 110H1 of the frame 110. In other words, in a plan view, the plurality of connection holes 110H1 of the frame 110 may be disposed in the connection hole 130H1 of the heating film 130.

The coupling holes 130H2 of the heating film 130 may be disposed at an edge of the heating film 130, for example. In other words, the coupling holes 130H2 of the heating film 130 may be disposed corresponding to coupling holes 110H2 of the frame 110, such that the coupling holes 130H2 of the heating film 130 and the coupling holes 110H2 of the frame 110 may overlap in a Z-axis direction. Coupling pins of the aforementioned socket guide 140 may be inserted into the coupling holes 130H2 of the heating film 130 and the coupling holes 110H2 of the frame 110 arranged in a row along the Z-axis direction. For example, one coupling pin may be inserted into two coupling holes arranged in a row along the Z-axis direction (e.g., the coupling hole 110H2 of the frame 110 and the coupling hole 130H2 of the heating film 130 disposed corresponding thereto). The coupling pins of the socket guide 140 may penetrate the coupling holes 130H2 of the heating film 130 and the coupling holes 110H2 of the frame 110 to be inserted into coupling recesses of a test board 200.

The heating wire 150 of FIG. 9 may include a conductive material having high thermal and electrical conductivity. For example, the heating wire 150 may include any one of copper, nickel, and chromium, or may include at least two of the above-mentioned copper, nickel, and chromium.

In an embodiment, the heating wire 150 of FIG. 9 may have any one shape among the shapes of the first to third heating wires 151, 152, and 153 of FIG. 5, the first to fourth heating wires 151, 152, 153, and 154 of FIG. 6, and the heating wire 150 of FIG. 7.

Figure 10:
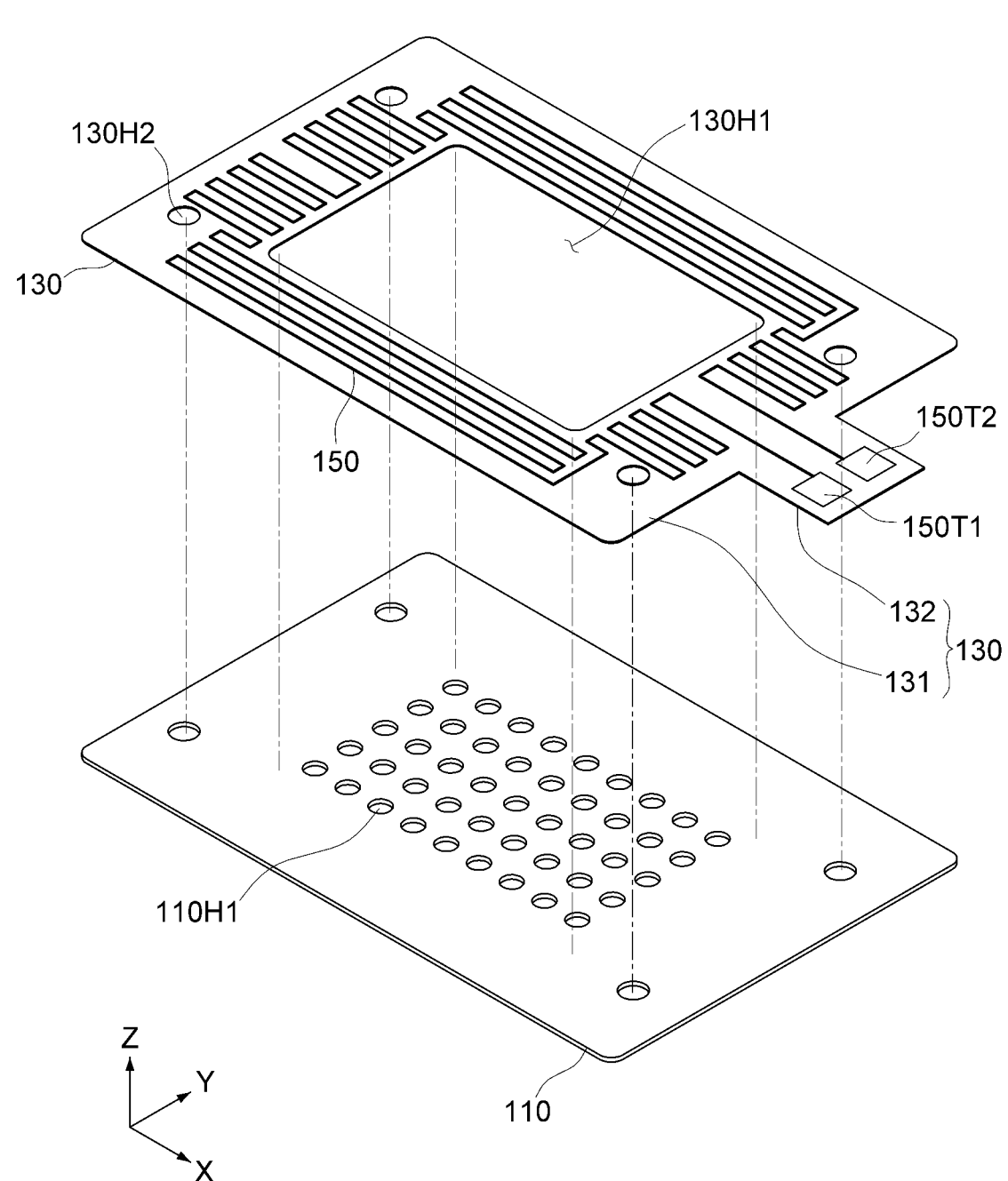
FIG. 10 is a three-dimensional view illustrating a frame and a film of a test socket according to another embodiment of the present disclosure.

FIG. 10 is a three-dimensional view illustrating a frame 110 and a film of a test socket 100 according to another embodiment of the present disclosure.

As illustrated in FIG. 10, the heating film 130 may further include an extension portion 132. For example, the heating film 130 may include a main body 131 overlapping the frame 110 and an extension portion 132 extending from the main body 131 in an X-axis direction. The extension portion 132 of the heating film 130 does not overlap the frame 110, and a first terminal 150T1 and a second terminal 150T2 of the heating wire 150 may be disposed on the extension portion 132.

Since the heating wire 150 of the heating film 130 illustrated in FIG. 10 is substantially the same as the heating wire 150 of FIG. 9, the description of the heating film 130 of FIG. 10 will refer to the related descriptions for the heating wire 150 of FIG. 9.

In an embodiment, the heating wire 150 of FIG. 10 may have any one shape among the shapes of the first to third heating wires 151, 152, and 153 of FIG. 5, the first to fourth heating wires 151, 152, 153, and 154 of FIG. 6, and the heating wire 150 of FIG. 7.

Figure 11:
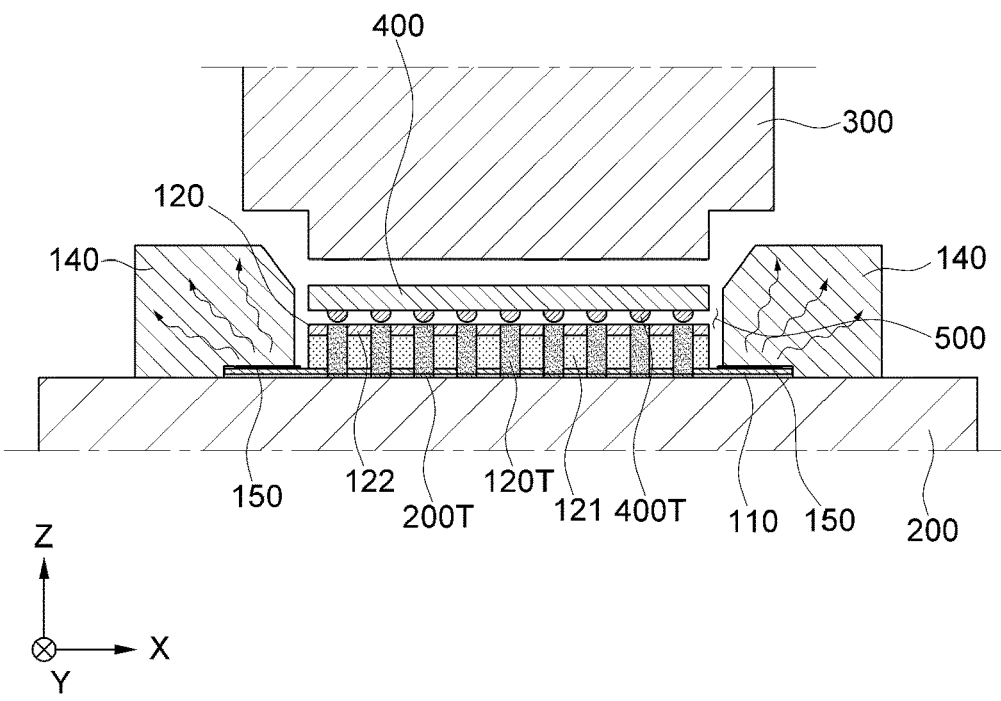
FIG. 11 is a cross-sectional view illustrating a test socket and various peripheral apparatuses according to another embodiment of the present disclosure.

FIG. 11 is a cross-sectional view illustrating a test socket 100 and various peripheral apparatuses according to another embodiment of the present disclosure.

As illustrated in FIG. 11, the test socket 100 of the present disclosure may further include a socket guide 140. In other words, the test socket 100 of the present disclosure may include a connection portion 120, a frame 110, and the socket guide 140. Herein, the structure including the connection portion 120 and the frame 110 may be defined as a socket body of the test socket 100, and the socket guide 140 may serve to align the socket body with respect to a test board 200. In an embodiment, when the test socket 100 of the present disclosure includes a heating film 130 as in the embodiment of FIGS. 9 and 10 described above, the socket body may further include the heating film 130 described above.

The socket guide 140 may be disposed on a board of the test board 200 and the frame 110. The socket guide 140 may be disposed along an edge of the frame 110. In other words, in a plan view, the socket guide 140 may be disposed on an edge of the frame 110 to surround a center portion of the frame 110.

The socket guide 140 may contact the heating wire 150. For example, when the heating wire 150 is disposed on an upper surface Su of the frame 110, at least a portion of the heating wire 150 may be disposed between the upper surface Su of the frame 110 and the socket guide 140, and in such a case, at least a portion of the heating wire 150 may contact the socket guide 140.

The socket guide 140 may include a metal (e.g., aluminum) or non-metal (e.g., plastic) material having good thermal conductivity. Furthermore, the socket guide 140 may include a thermally conductive plastic material that has an insulating (or non-conductive) property while having excellent thermal conductivity. When the socket guide 140 is made of a non-conductive material such as plastic or the afore-mentioned thermally conductive plastic, an insulating film for insulating the heating wire 150 printed on the frame 110 may be omitted.

The device under test 400 may be disposed in a space 500 (hereinafter, a "pressurization space 500") defined by being surrounded by the test board 200, the socket guide 140, and a pressing portion 300. Specifically, the device under test 400 may be disposed on the connection portion 120 in the pressurization space 500. Herein, the pressing portion 300 may descend along a −Z-axis direction to press the device under test 400 disposed therebelow in the −Z-axis direction. Due to a pressure applied from the pressing portion 300, contact between a device terminal 400T of the device under test 400 and a signal conductive portion 120T of the connection portion 120, and contact between the signal conductive portion 120T of the connection portion 120 and a pad terminal 200T of the test board 200 may be stably maintained. When the device under test 400 is pressed by the pressing portion 300, the pressurization space 500 described above may be maintained in an airtight state.

Heat generated from the heating wire 150 (e.g., a curved arrow illustrated in FIG. 11) may be transferred to the socket guide 140 in contact with the heating wire 150. Heat from the heating wire 150 and heat from the socket guide 140 may be applied to the device under test 400. For example, the heat from the heating wire 150 and the heat from the socket guide 140 may be transferred to the device under test 400 through at least one of convection and radiation in the sealed pressurization space 500. As a specific example, the heat from the heating wire 150 and the heat from the socket guide 140 may be transferred to the device under test 400 in a convection manner through a medium (e.g., air) in the sealed pressurization space 500. In addition, when the sealed pressurization space 500 is in a vacuum state, heat from the heating wire 150 and heat from the socket guide 140 may be transferred to the device under test 400 through radiation (e.g., thermal radiation).

As such, according to the present disclosure, since the heating wire 150 is disposed on the frame 110 of the test socket 100, a separate external apparatus such as a chamber is not necessary to provide heat required for burn-in tests. Accordingly, it is possible to simplify the equipment required for burn-in tests, so there is no space restriction, and costs may also be reduced. Furthermore, since a heat source (e.g., the heating wire 150) is disposed close to the device under test 400, heat loss may be reduced and rapid heat transfer may be possible, thereby shortening the burn-in test time.

Figure 12:
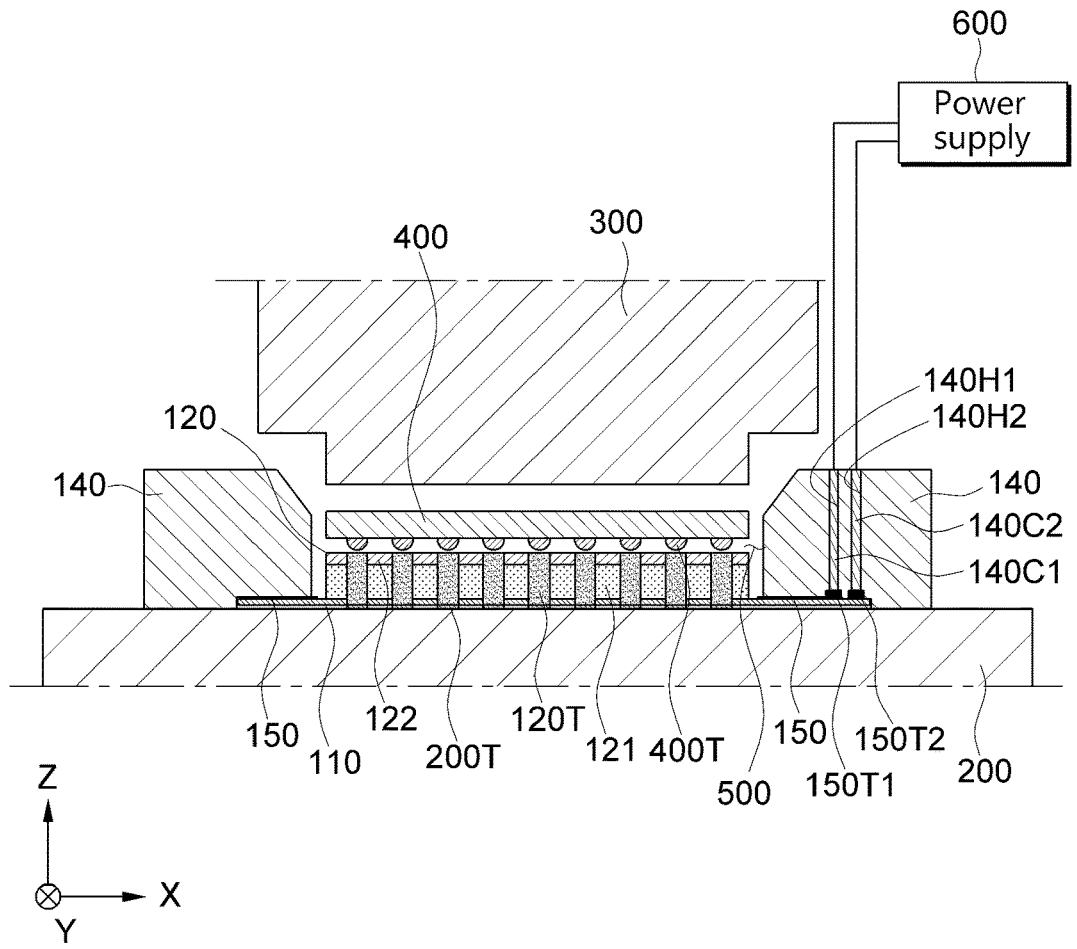
FIG. 12 is a cross-sectional view illustrating a test socket and various peripheral apparatuses according to another embodiment of the present disclosure.

FIG. 12 is a cross-sectional view illustrating a test socket 100 and various peripheral apparatuses according to another embodiment of the present disclosure.

As illustrated in FIG. 12, a heating wire 150 may be connected to a power supply 600 through holes 140H1 and 140H2 of a socket guide 140. For example, a first terminal 150T1 of the heating wire 150 may be connected to a positive polarity terminal of the power supply 600 through a first conductive portion 140C1 disposed in the first hole 140H1 of the socket guide 140, and a second terminal 150T2 of the heating wire 150 may be connected to a negative polarity terminal of the power supply 600 through a second conductive portion 140C2 disposed in the second hole 140H2 of the socket guide 140.

When the socket guide 140 is made of a conductive metal material, in order to prevent short circuit between the socket guide 140 and the heating wire 150, a first insulating portion may be further disposed between an inner wall of the first hole 140H1 and the first conductive portion 140C1, and a second insulating portion may be further disposed between an inner wall of the second hole 140H2 and the second conductive portion 140C2. In such a case, the first insulating portion may surround the first conductive portion 140C1, and the second insulating portion may surround the second conductive portion 140C2.

Figure 13:
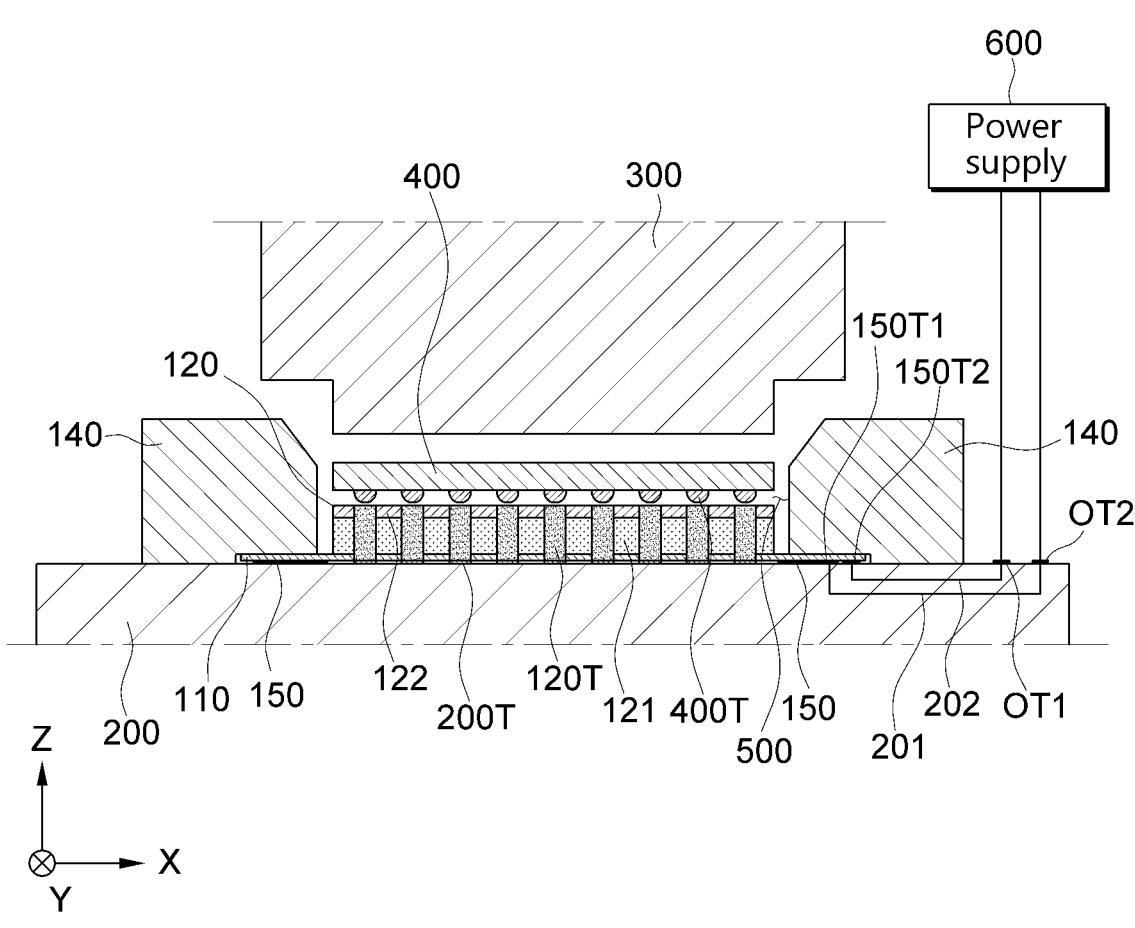
FIG. 13 is a cross-sectional view illustrating a test socket and various peripheral apparatuses according to another embodiment of the present disclosure.

FIG. 13 is a cross-sectional view illustrating a test socket 100 and various peripheral apparatuses according to another embodiment of the present disclosure.

As illustrated in FIG. 13, when a heating wire 150 is disposed on a lower surface Sb of the frame 110, the heating wire 150 may be disposed between a frame 110 and a test board 200. In such a case, the heating wire 150 may be connected to a power supply 600 through the test board 200. For example, a first terminal 150T1 of the heating wire 150 may be connected to a positive polarity terminal of the power supply 600 through a first conductive pattern 201 disposed in a board of the test board 200, and a second terminal 150T2 of the heating wire 150 may be connected to a negative polarity terminal of the power supply 600 through a second conductive pattern 202 disposed in the board of the test board 200. In such a case, a first terminal OT1 may be disposed at an end portion of the first conductive pattern 201 exposed to the outside of the pressurization space 500, and a second terminal OT2 may be disposed at an end portion of the second conductive pattern 202 exposed to the outside of the pressurization space 500. The first terminal OT1 of the first conductive pattern 201 may be connected to the positive polarity terminal of the power supply 600, and the second terminal OT2 of the second conductive pattern 202 may be connected to the negative polarity terminal of the power supply 600.

As illustrated in FIG. 13, the heating wire 150 may not contact the socket guide 140. However, at least a portion of the heating wire 150 may overlap the socket guide 140. Even in such a case, heat generated from the heating wire 150 may be transferred to the socket guide 140 that overlaps the heating wire 150.

Figure 14:
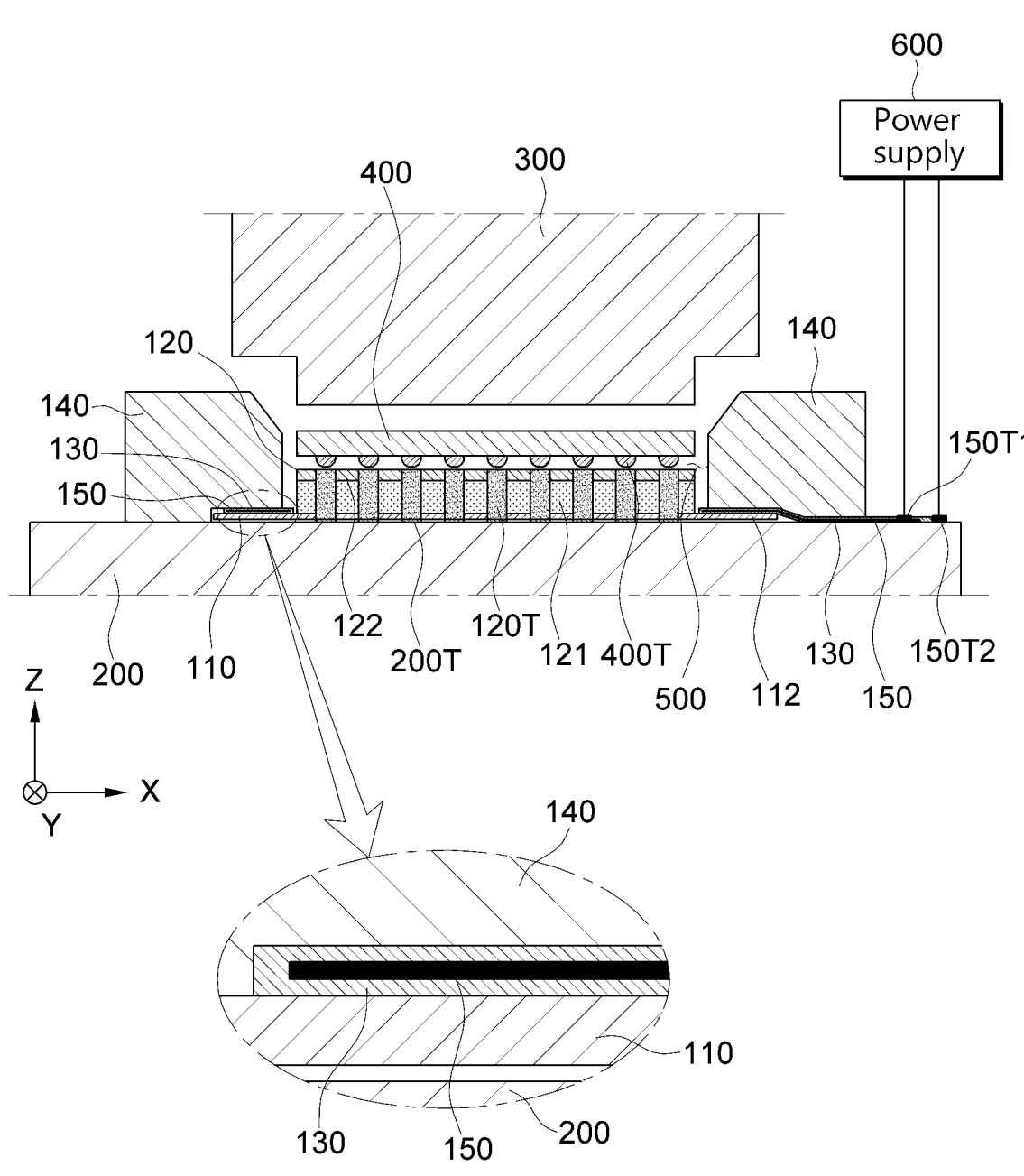
FIG. 14 is a cross-sectional view illustrating a test socket and various peripheral apparatuses according to another embodiment of the present disclosure.

FIG. 14 is a cross-sectional view illustrating a test socket 100 and various peripheral apparatuses according to another embodiment of the present disclosure.

As illustrated in FIG. 14, when a heating film 130 having an extension portion 132 is used (or when a frame 110 having an extension portion 112 is used), the extension portion 112 of the heating film 130 may be disposed outside of the socket guide 140. In other words, the extension portion 112 of the heating film 130 may extend to the outside of the pressurization space 500 through a gap between the socket guide 140 and the test board 200. In such a case, the first terminal 150T1 of the heating wire 150 disposed on the extension portion 112 of the heating film 130 may be connected to a positive polarity terminal of the power supply 600, and a second terminal 150T2 of the heating wire 150 disposed on the extension portion 112 of the heating film 130 may be connected to a negative polarity terminal of the power supply 600.

Figure 15:
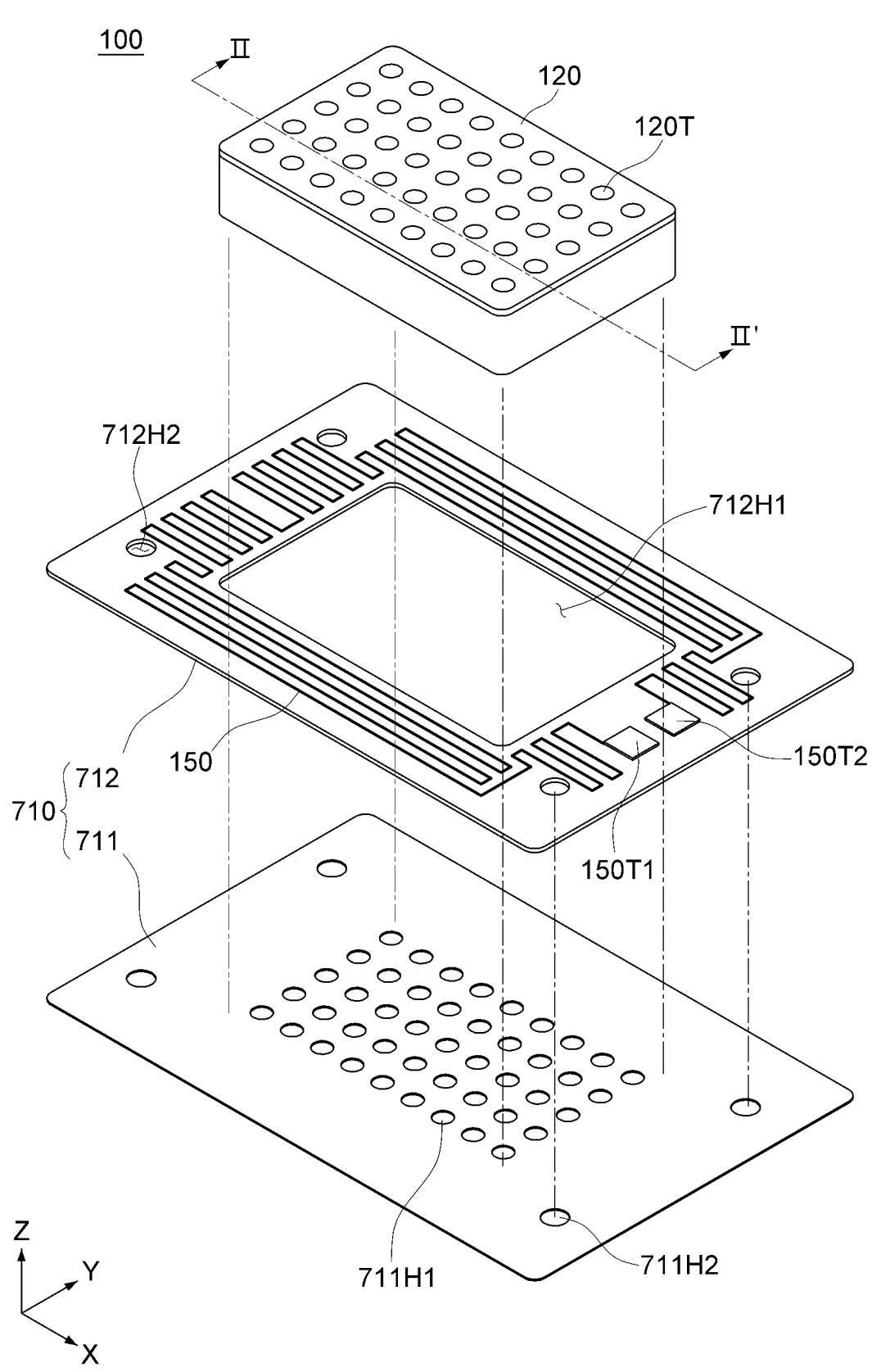
FIG. 15 is an exploded three-dimensional view illustrating a test socket according to another embodiment of the present disclosure.
Figure 16:
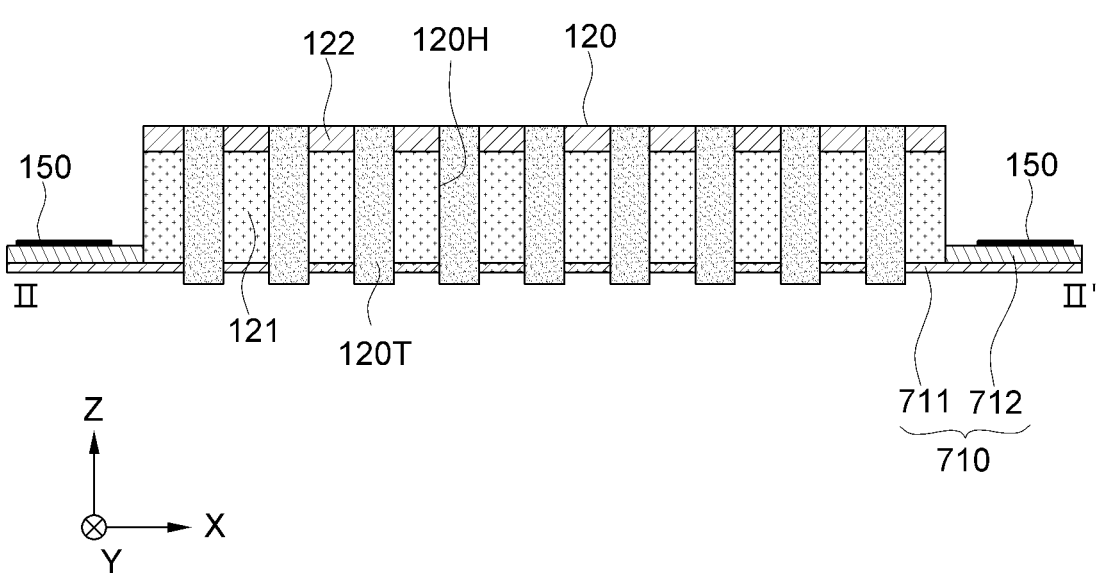
FIG. 16 is a cross-sectional view taken along the line II-II' when components of the test socket of FIG. 15 are combined.

FIG. 15 is an exploded three-dimensional view illustrating a test socket 100 according to another embodiment of the present disclosure, and FIG. 16 is a cross-sectional view taken along line II-II' when components of the test socket 100 of FIG. 15 are combined with each other. In an embodiment, a combined view of the test socket 100 of FIG. 15 may have substantially the same shape as that of FIG. 2.

As illustrated in FIGS. 15 and 16, the test socket 100 of the present disclosure may include a frame 710 and a connection portion 120, where the frame 710 may include a support film 711 and a plate 712.

The support film 711 may be disposed below the plate 712. For example, the support film 711 may be disposed between a test board 200 (e.g., a board of test board 200) and the plate 712. The support film 711 may have a plurality of connection holes 711H1 at its center. The support film 711 may support the connection portion 120.

The plate 712 may be made of a hard material and may support the support film 711 so that a shape of the support film 711 made of a soft material may be maintained constant. This plate 712 may be disposed on the support film 711. For example, the plate 712 may be disposed between the support film 711 and the connection portion 120. The plate 712 may have a connection hole 712H1 penetrating its center. In a plan view, the connection hole 712H1 surrounds a plurality of connection holes 711H1 of the support film 711. In other words, in a plan view, the plurality of connection holes 711H1 of the support film 711 may be disposed in the connection hole 712H1 of the plate 712.

Furthermore, the support film 711 and the plate 712 may include a plurality of coupling holes 711H2 and 712H2 arranged to correspond to each other. For example, the coupling holes 711H2 of the support film 711 may be disposed at an edge of the support film 711, and the coupling holes 712H2 of the plate 712 may be disposed at an edge of the plate 712. Each of the coupling holes 711H2 and 712H2 of the support film 711 and the plate 712 may be used to couple the support film 711, the plate 712, and the socket guide 140. For example, each of coupling pins protruding from the socket guide 140 may be inserted into each of the corresponding coupling holes 711H2 and 712H2, such that the support film 711, the plate 712, and the socket guide 140 may be coupled to each other. The coupling pins of the socket guide 140 may pass through the coupling holes 711H2 and 712H2 and be inserted into coupling recesses of the test board 200.

The heating wire 150 may be disposed on the frame 710. For example, when a surface facing (or in contact with) the test board 200 among a plurality of surfaces of the frame 710 is defined as a lower surface of the frame 710, and a surface disposed opposite to the lower surface is defined as an upper surface of the frame 710, the heating wire 150 may be disposed on the upper surface of the frame 710 (e.g., an edge of the upper surface of the frame 710). In an embodiment, the heating wire 150 may be disposed on the lower surface of the frame 710 (e.g., an edge of the lower surface of the frame 710), instead of the upper surface of the frame 710. Furthermore, the heating wire 150 may be disposed on both the upper and lower surfaces of the frame 710. When the heating wire 150 is disposed on the upper surface of the frame 710, the heating wire 150 may contact the upper surface of the frame 710, and when the heating wire 150 is disposed on the lower surface of the frame 710, the heating wire 150 may contact the lower surface of the frame 710. Herein, the upper surface of the frame 710 corresponds to, for example, the upper surface of the plate 712, and the lower surface of the frame 710 corresponds to the lower surface of the support film 711. FIG. 15 illustrates an example in which the heating wire 150 is disposed on the upper surface of the frame 710, that is, the upper surface of the plate 712.

In an embodiment, the heating wire 150 of FIG. 15 may be formed by printing or deposition on at least one surface of the frame 710 (e.g., at least one of the upper surface and the lower surface of the frame 710 described above). In other words, the heating wire 150 may be attached onto the frame 710 by being printed or deposited on at least one of the upper surface of the plate 712 and the lower surface of the support film 711.

The heating wire 150 may include a conductive material having high thermal and electrical conductivity. For example, the heating wire 150 may include any one of copper, nickel, and chromium, or may include at least two of the above-mentioned copper, nickel, and chromium.

The remaining portions of the heating wire 150, except for a first terminal 150T1 and a second terminal 150T2, may be insulated with, for example, an insulating material. To this end, as an example, the remaining portions of the heating wire 150 except for the first terminal 150T1 and the second terminal 150T2 may be surrounded with an insulating material.

In an embodiment, the heating wire 150 of FIG. 15 may have any one shape among the shapes of the first to third heating wires 151, 152, and 153 of FIG. 5, the first to fourth heating wires 151, 152, 153, and 154 of FIG. 6, and the heating wire 150 of FIG. 7.

Furthermore, as another embodiment, the heating wire 150 of FIG. 15 may be disposed between the support film 711 and the plate 712.

The first terminal 150T1 and the second terminal 150T2 of the heating wire 150 of FIG. 15 may be connected to a power supply. In such a case, the first terminal 150T1 and the second terminal 150T2 of the heating wire 150 of FIG. 15 may be connected to the power supply through the holes 140H1 and 140H2 of the socket guide 140, as illustrated in FIG. 12. In an embodiment, the first terminal 150T1 and the second terminal 150T2 of the heating wire 150 of FIG. 15 may be connected to the power supply via the first conductive pattern 201 and the second conductive pattern 202 disposed on the board of the test board 200, as illustrated in FIG. 13.

In an embodiment, the socket frame 110 of FIG. 15 may further include either the heating film 130 of FIG. 9 or the heating film 130 of FIG. 10, and in such a case, the heating wire 150 disposed on the frame 110 of FIG. 15 may be omitted. In such an embodiment, the first terminal 150T1 and the second terminal 150T2 of the heating wire 150 of FIG. 15 may be connected to a power supply outside the socket guide 140, as illustrated in FIG. 14.

Additionally, as another embodiment, the heating wire 150 of FIG. 15 may be disposed in the support film 711, similar to the heating wire 150 of FIG. 9. In such an embodiment, the support film 711 may serve the same function as the heating film 130 of FIG. 9 or 10. In such an embodiment, the support film 711 including the heating wire 150 therein may replace the heating film 130. Additionally, such support film 711 may be disposed on the upper surface of the plate 712, rather than the lower surface of the plate 712, and contact the socket guide 140.

Figure 17:
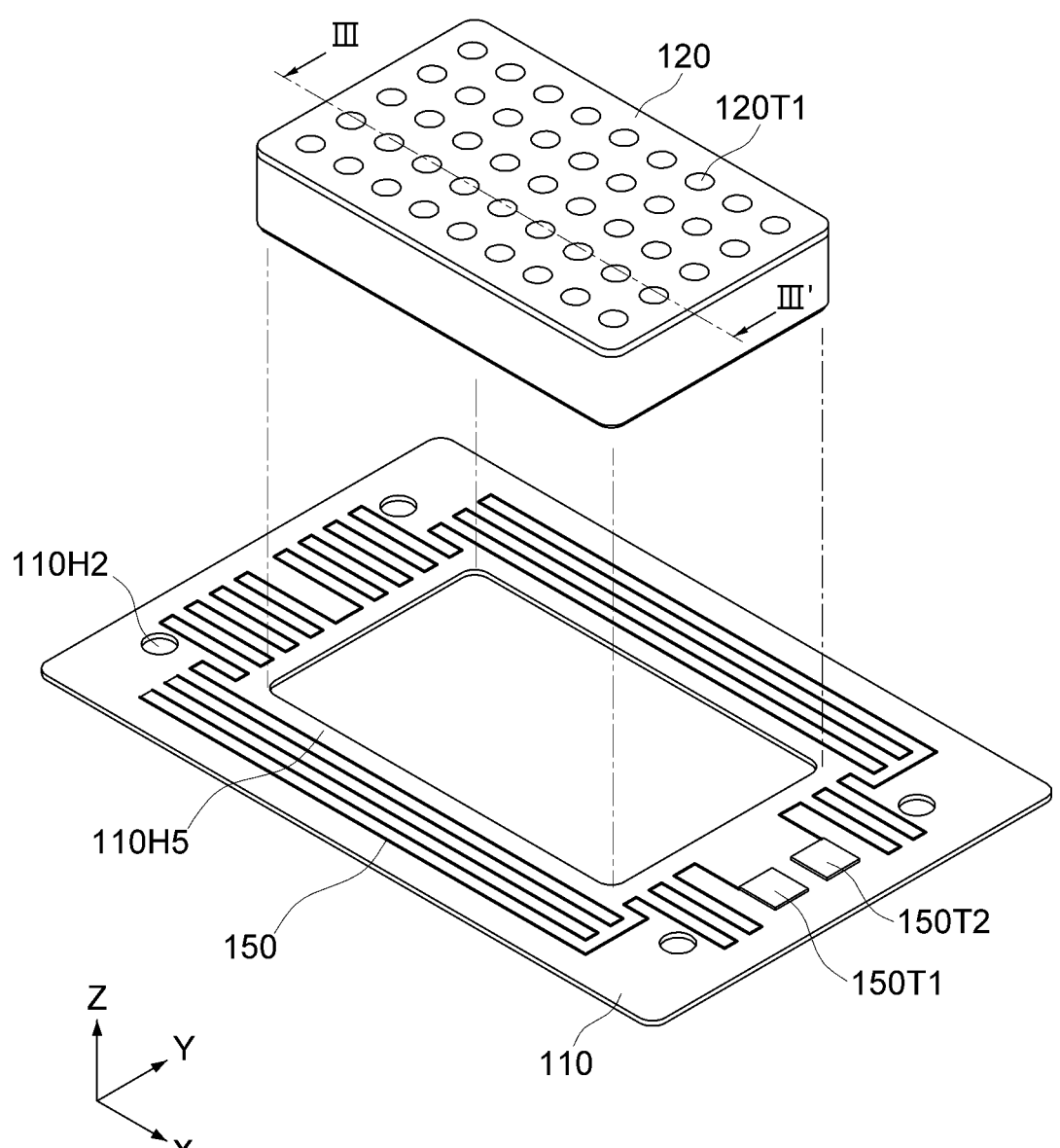
FIG. 17 is an exploded three-dimensional view illustrating a test socket according to another embodiment of the present disclosure.
Figure 18:
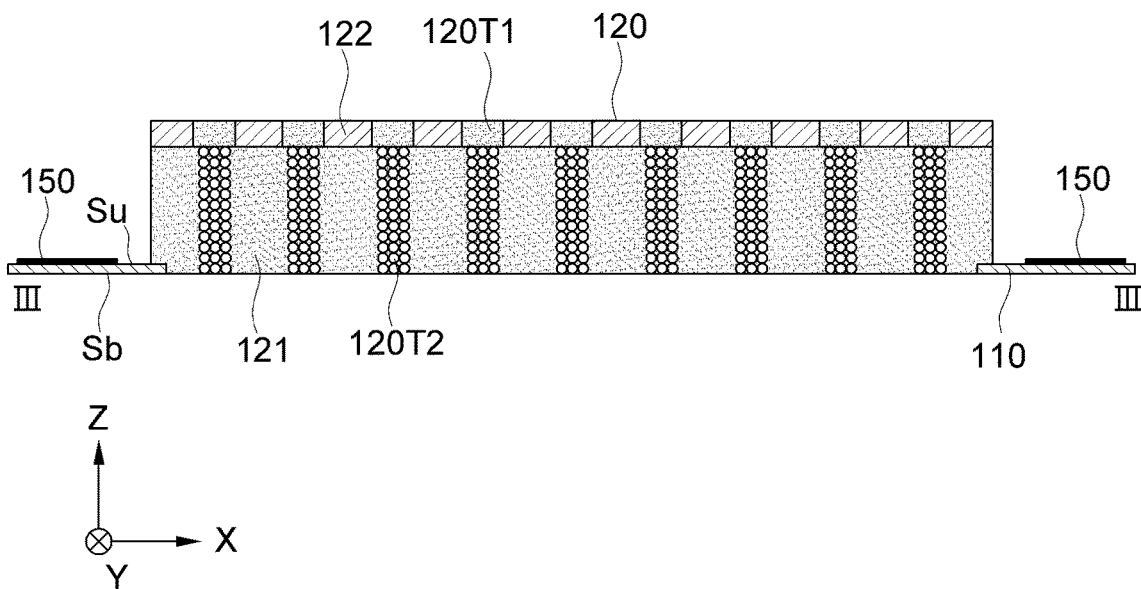
FIG. 18 is a cross-sectional view taken along the line III-III' when components of the test socket of FIG. 17 are combined.

FIG. 17 is an exploded three-dimensional view illustrating a test socket according to another embodiment of the present disclosure, and FIG. 18 is a cross-sectional view taken along the line III-III' when components of the test socket of FIG. 17 are combined with each other. In an embodiment, a combined view of the test socket 100 of FIG. 17 may have substantially the same shape as that of FIG. 2.

As illustrated in FIGS. 17 and 18, the test socket 100 of the present disclosure may include a frame 710 and a connection portion 120.

The frame 110 may support the connection portion 120. The frame 110 may include a material such as stainless steel. As such, when the frame is made of a metal material such as stainless steel, in order to prevent short circuits between adjacent signal conductive portions 120T2, the frame may have one connection hole 110H5 surrounding all of the plurality of signal conductive portions.

The connection portion 120 may have a larger size than the connection hole of the frame 110, and accordingly, when the connection portion 120 is coupled to the frame 110, an edge of the connection portion 120 may be disposed on the frame 110, and a portion except for the edge of the connection portion 120 may be inserted into the connection hole 110H5 of the frame 110.

The connection portion 120 may include a first insulating portion 121, a plurality of signal conductive portions 120T2, and a second insulating portion 122. Herein, each of the plurality of signal conductive portions 120T2 may include a plurality of conductive particles. The second insulating portion 122 may include a plurality of through holes arranged to correspond to the signal conductive portions 120T2, and a conductive portion 120T1 may be inserted into each of these through holes to contact the above-described signal conductive portion 120T2.

Coupling holes 110H2 of the frame 110 may be disposed at an edge of the frame 110, for example. The coupling holes 110H2 may be used to couple the frame 110 and a socket guide (e.g., 140 in FIG. 11) to be described below. For example, each of coupling pins protruding from the socket guide 140 may be inserted into each of the corresponding coupling holes 110H2, such that the frame 110 and the socket guide 140 may be coupled to each other. In an embodiment, the coupling pins of the socket guide 140 may penetrate through the coupling holes 110H2 to be inserted into coupling recesses of the test board 200.

The heating wire 150 of the frame 110 is, for example, intended to provide heat required for a burn-in test of the device under test 400, and such a heating wire 150 may be disposed on the frame 110. The description of this heating wire will refer to the related description of FIGS. 1 to 16 described above.

Figure 19:
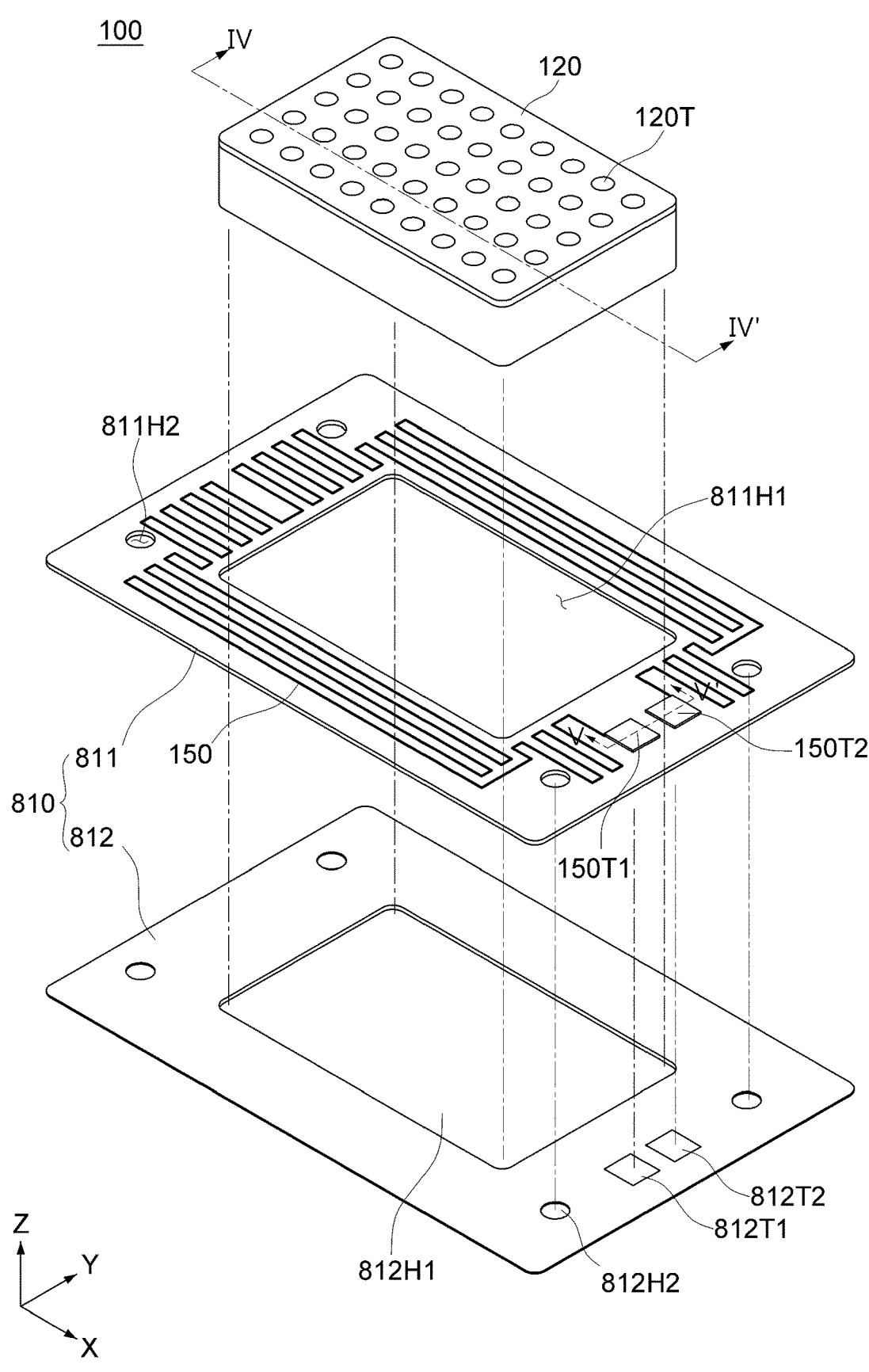
FIG. 19 is an exploded three-dimensional view illustrating a test socket according to another embodiment of the present disclosure.
Figure 20:
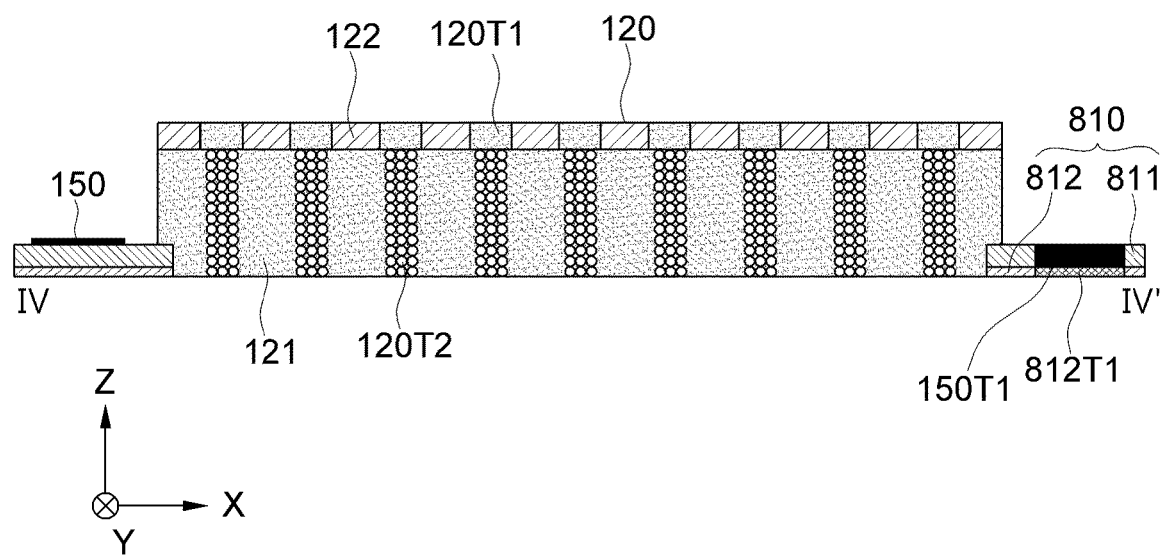
FIG. 20 is a cross-sectional view taken along line IV-IV' when components of the test socket of FIG. 19 are combined.
Figure 21:
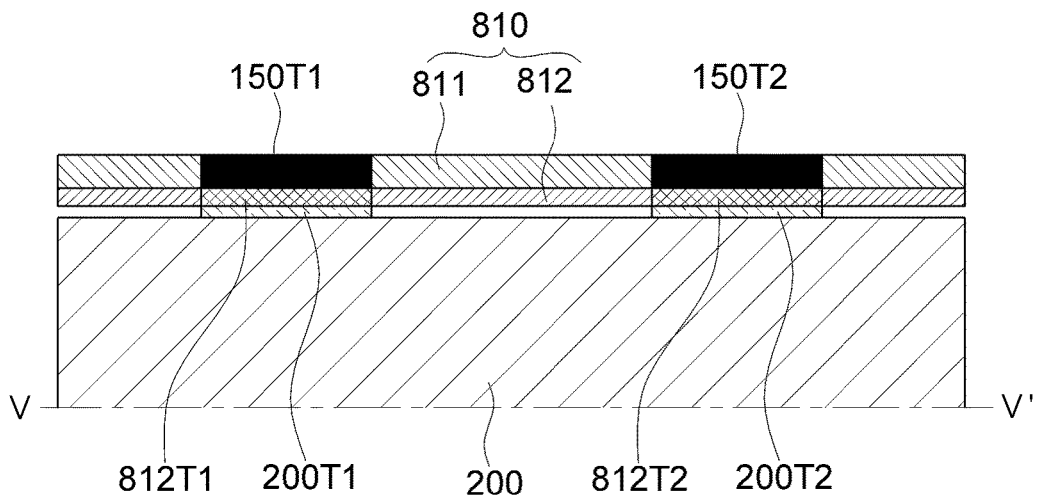
FIG. 21 is a cross-sectional view taken along the line V-V' when components of the test socket of FIG. 19 are combined and disposed on a test board.

FIG. 19 is an exploded three-dimensional view illustrating a test socket 100 according to another embodiment of the present disclosure, FIG. 20 is a cross-sectional view taken along line IV-IV' when components of the test socket 100 of FIG. 19 are combined with each other, and FIG. 21 is a cross-sectional view taken along line V-V' when components of the test socket 100 of FIG. 19 are combined and disposed on a test board. In an embodiment, a combined view of the test socket 100 of FIG. 20 may have substantially the same shape as that of FIG. 2.

As illustrated in FIGS. 19, 20, and 21, the test socket 100 of the present disclosure may include a frame 810 and a connection portion 120, where the frame 810 may include a plate 812 and a support film 811.

The plate 812 may be disposed below the support film 811. For example, the plate 812 may be disposed between a test board 200 (e.g., a board of the test board 200) and the support film 811. The plate 812 may have, at its center, a connection hole 812H1 penetrating the center. The plate 812 may support the connection portion 120. The plate 812 may be made of a hard material and may support the support film 811 such that a shape of the support film 811 made of a soft material may be maintained constant.

The support film 811 may be disposed on the plate 812. For example, the support film 811 may be disposed between the plate 812 and the connection portion 120. The support film 811 may have, at its center, a connection hole 811H1 penetrating the center. The connection hole 811H1 of the support film 811 may be disposed to correspond to the connection hole 812H1 of the plate 812.

Furthermore, the plate 812 and the support film 811 may include a plurality of coupling holes 812H2 and 811H2 arranged to correspond to each other. For example, the coupling holes 812H2 of the plate 812 may be disposed at an edge of the plate 812, and the coupling holes 811H2 of the support film 811 may be disposed at an edge of the support film 811. Each of the coupling holes 812H2 and 811H2 of the plate 812 and the support film 811 may be used to couple the plate 812, the support film 811, and a socket guide 140. For example, each of coupling pins protruding from the socket guide 140 may be inserted into each of the corresponding coupling holes 812H2 and 811H2, such that the support film 812, the plate 811, and the socket guide 140 may be coupled to each other. In an embodiment, the coupling pins of the socket guide 140 may penetrate through the coupling holes 812H2 and 811H2 to be inserted into coupling recesses of the test board 200.

The heating wire 150 may be disposed on the support film 811. For example, the heating wire 150 may be disposed on at least one of an upper surface, a lower surface, and interior of the support film 811 described above. In an embodiment, the heating wire 150 may be formed by printing or deposition on at least one surface of the support film 811. In other words, the heating wire 150 may be attached onto the support film 811 by being printed or deposited on at least one surface of the upper surface and the lower surface of the support film 811.

The heating wire 150 may include a conductive material having high thermal and electrical conductivity. For example, the heating wire 150 may include any one of copper, nickel, and chromium, or may include at least two of the above-mentioned copper, nickel, and chromium.

The remaining portions of the heating wire 150, except for a first terminal 150T1 and a second terminal 150T2, may be insulated with, for example, an insulating material. To this end, as an example, the remaining portions of the heating wire 150 except for the first terminal 150T1 and the second terminal 150T2 may be surrounded with an insulating material.

As an example illustrated in FIG. 20, the heating wire 150 may be disposed on the upper surface of the support film 811, and the first terminal 150T1 and the second terminal 150T2 of the heating wire 150 may be disposed in the support film 811. As a specific example, the first terminal 150T1 and the second terminal 150T2 of the heating wire 150 may be disposed in a hole (i.e., a hole of the support film 811) penetrating the support film 811 along a Z-axis direction.

Furthermore, as illustrated in FIG. 19, at least one relay terminal may be further disposed on the plate 812. For example, a first relay terminal 812T1 may be disposed to correspond to the first terminal 150T1 of the heating wire 150, and a second relay terminal 812T2 may be disposed to correspond to the second terminal 150T2 of the heating wire 150. In other words, the first relay terminal 812T1 may be disposed to overlap the first terminal 150T1 of the heating wire 150, and the second relay terminal 812T2 may be disposed to overlap the second terminal 150T2 of the heating wire 150.

As illustrated in FIGS. 20 and 21, the first relay terminal 812T1 and the second relay terminal 812T2 may be disposed in the plate 812. As a specific example, the first relay terminal 812T1 and the second relay terminal 812T2 may be disposed in a hole penetrating the plate 812 along the Z-axis direction (i.e., a hole in the plate 812). In such a case, as illustrated in FIGS. 20 and 21, the first relay terminal 812T1 may be connected to the first terminal 150T1 thereabove, and the second relay terminal 812T2 may be connected to the second terminal 150T2 therebelow.

Furthermore, as illustrated in FIG. 21, the first relay terminal 812T1 and the second relay terminal 812T2 may be connected to the test board 200 therebelow. For example, the first relay terminal 812T1 may be connected to a first power terminal 200T1 disposed on the board of the test board 200, and the second relay terminal 812T2 may be connected to a second power terminal 200T2 disposed on the board of the test board 200. In such a case, the first power terminal 200T1 may be disposed immediately below the first relay terminal 812T1 so as to overlap the first relay terminal 812T1, and the second power terminal 200T2 may be disposed immediately below the second relay terminal 812T2 so as to overlap the second relay terminal 812T2. In such a case, the first power terminal 200T1, the first relay terminal 812T1, and the first terminal 150T1 may be arranged in a row along the Z-axis direction to overlap each other, and the second power terminal 200T2, the second relay terminal 812T2 and the second terminal 150T2 may be arranged in a row along the Z-axis direction to overlap each other.

The first relay terminal 812T1 may be disposed between the first terminal 150T1 of the heating wire 150 and the first power terminal 200T1 of the test board 200 to relay electrical connection between the first power terminal 200T1 and the first terminal 150T1, and the second relay terminal 812T2 may be disposed between the second terminal 150T2 of the heating wire 150 and the second power terminal 200T2 of the test board 200 to relay electrical connection between the power terminal 200T2 and the second terminal 150T2.

The first power terminal 200T1 may be connected, for example, to a positive polarity terminal of the power supply 600 described above, and the second power terminal 200T2 may be connected, for example, to a negative polarity terminal (or a ground terminal) of the power supply 600 described above. A positive voltage from the power supply 600 may be supplied to the first terminal 150T1 of the heating wire 150 through the first power terminal 200T1 and the first relay terminal 812T1, and a negative voltage from the power supply 600 may be supplied to the second terminal 150T2 of the heating wire 150 through the second power terminal 200T2 and the second relay terminal 812T2. The heating wire 150 may generate heat by receiving the positive and negative voltages from the power supply 600.

The first relay terminal 812T1 and the second relay terminal 812T2 may each include a metal conductor. Furthermore, the first relay terminal 812T1 and the second relay terminal 812T2 may each include at least one conductive particle. The detailed description of the conductive particles will refer to the description of the conductive particles of the signal conductive portion 120T described above.

Furthermore, the first relay terminal 812T1 and the second relay terminal 812T2 may include the above-described conductive particles and an insulating material surrounding the conductive particles. In such a case, since opposite ends of the insulating material expose the conductive particles, the conductive particles exposed to opposite ends of the insulating material may be connected to the terminal of the above-described heating wire and the power terminal of the test board 200.

As such, the embodiment of FIGS. 19 to 21 has a structure in which the terminal of the heating wire, the relay terminal, and the power terminal are arranged in a row along the Z-axis direction and directly contact each other to receive power, thereby achieving excellent properties in terms of manufacturing-related aspects (e.g., manufacturing method and manufacturing cost, etc.) and thermal efficiency.

In another embodiment, the support film 811 may be disposed below the plate 812, for example. In other words, the support film 811 may be disposed between the plate 812 and the test board 200 (e.g., the board of the test board 200). However, in such a case, the first power terminal 200T1 and the second power terminal 200T2 of the test board 200 may be directly connected to the first terminal 150T1 and the second terminal 150T2 of the heating wire 150 provided on the support film 812, respectively, and thus the first relay terminal 811T1 and the second relay terminal 811T2 of the plate 811 may be omitted.

In an embodiment, the heating wire 150 of FIG. 19 may have any one shape among the shapes of the first to third heating wires 151, 152, and 153 of FIG. 5, the first to fourth heating wires 151, 152, 153, and 154 of FIG. 6, and the heating wire 150 of FIG. 7.

The connection portion 120 of FIGS. 19 and 20 may include a first insulating portion 121, a plurality of signal conductive portions 120T2, and a second insulating portion 122, and the connection portion 120 of FIGS. 19 and 20 is substantially the same as the connection portion 120 of FIG. 18 described above, so the detailed description of the connection portion 120 of FIGS. 19 and 20 will refer to FIG. 18 and the related description.

Figure 22:
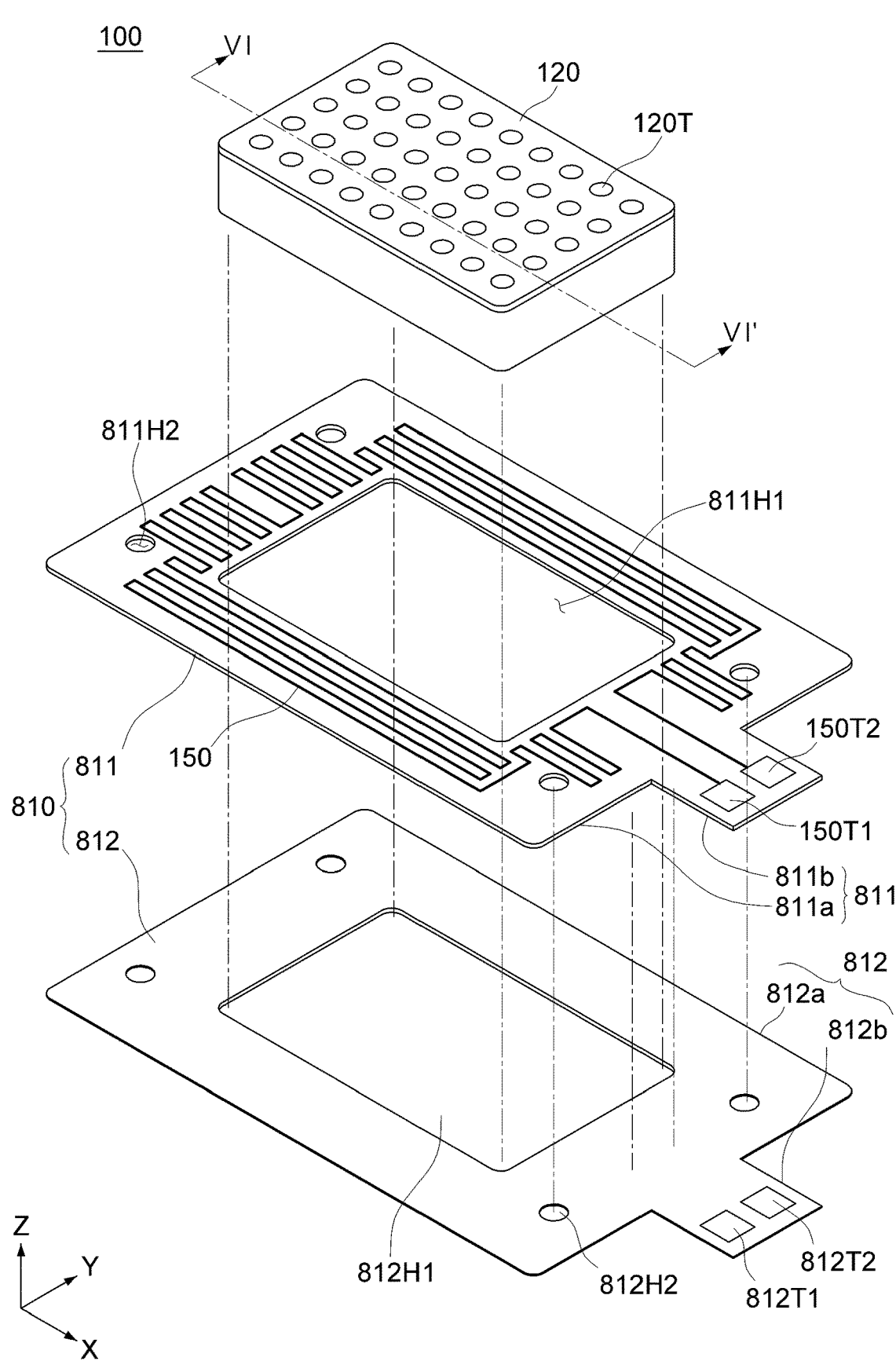
FIG. 22 is an exploded three-dimensional view illustrating a test socket according to another embodiment of the present disclosure.
Figure 23:
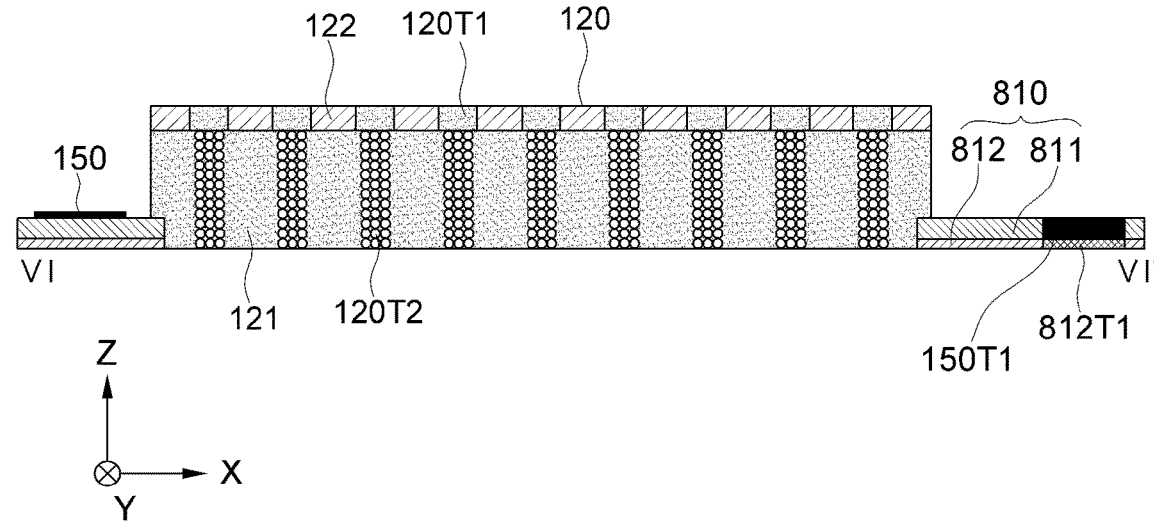
FIG. 23 is a cross-sectional view taken along the line VI-VI' when components of the test socket of FIG. 22 are combined.

FIG. 22 is an exploded three-dimensional view illustrating a test socket 100 according to another embodiment of the present disclosure, and FIG. 23 is a cross-sectional view taken along the line VI-VI' when components of the test socket 100 of FIG. 22 are combined with each other. In an embodiment, a combined view of the test socket 100 of FIGS. 22 and 23 may have substantially the same shape as that of FIG. 2.

As illustrated in FIGS. 22 and 23, the test socket 100 of the present disclosure may include a frame 810 and a connection portion 120, where the frame 810 may include a plate 812 and a support film 811.

The plate 812 may be disposed below the support film 811. For example, the plate 812 may be disposed between a test board 200 (e.g., a board of test board 200) and the support film 811. The plate 812 may have, at its center (e.g., a center of a main body 812a, which will be described below), a connection hole 812H1 penetrating the center. The plate 812 may support the connection portion 120. The plate 812 may be made of a hard material and may support the support film 811 such that a shape of the support film 811 made of a soft material may be maintained constant.

The plate 812 may include a main body 812a and an extension portion 812b. The extension portion 812b of the plate 812 may extend from the main body 812a of the plate 812 in an X-axis direction.

The support film 811 may be disposed on the plate 812. For example, the support film 811 may be disposed between the plate 812 and the connection portion 120. The support film 811 may have, at its center (e.g., a center of a main body 811a, which will be described below), a connection hole 811H1 penetrating the center. The connection hole 811H1 of the support film 811 may be disposed to correspond to the connection hole 812H1 of the plate 812.

The support film 811 may include a main body 811a and an extension portion 811b. The extension portion 811b of the support film 811 may extend from the main body 811a of the support film 811 in an X-axis direction. The main body 811a of the support film 811 may overlap the main body 812a of the plate 812, and the extension portion 811b of the support film 811 may overlap the extension portion 812b of the plate 812.

Furthermore, the plate 812 and the support film 811 may include a plurality of coupling holes 812H2 and 811H2 arranged to correspond to each other. For example, the coupling holes 812H2 of the plate 812 may be disposed at an edge of the plate 812, and the coupling holes 811H2 of the support film 811 may be disposed at an edge of the support film 811. Each of the coupling holes 812H2 and 811H2 of the plate 812 and the support film 811 may be used to couple the plate 812, the support film 811, and a socket guide 140. For example, coupling pins protruding from the socket guide 140 may be inserted into each of the corresponding coupling holes 812H2 and 811H2, respectively, such that the plate 812, the support film 811, and the socket guide 140 may be coupled to each other. In an embodiment, the coupling pins of the socket guide 140 may penetrate through the coupling holes 812H2 and 811H2 to be inserted into coupling recesses of the test board 200.

The heating wire 150 may be disposed on the support film 811. For example, the heating wire 150 may be disposed on at least one of an upper surface, a lower surface, and interior of the support film 811 described above. In an embodiment, the heating wire 150 may be formed by printing or deposition on at least one surface of the support film 110. In other words, the heating wire 150 may be attached onto the support film 110 by being printed or deposited on at least one surface of the upper surface and the lower surface of the support film 110. In such a case, the heating wire 150 may be disposed on at least one of the main body 811a and the extension portion 811b of the support film 811. As an example, the heating wire 150 may be disposed on both the main body 811a and the extension portion 811b of the support film 811. In such a case, the heating wire 150 may have a larger area in the main body 811a than in the extension portion 811b.

A first terminal 150T1 and a second terminal 150T2 of the heating wire 150 may be disposed on the extension portion 811b of the support film 811.

The heating wire 150 may include a conductive material having high thermal and electrical conductivity. For example, the heating wire 150 may include any one of copper, nickel, and chromium, or may include at least two of the above-mentioned copper, nickel, and chromium.

The remaining portions of the heating wire 150, except for a first terminal 150T1 and a second terminal 150T2, may be insulated with, for example, an insulating material. To this end, as an example, the remaining portions of the heating wire 150 except for the first terminal 150T1 and the second terminal 150T2 may be surrounded with an insulating material.

As an example illustrated in FIG. 23, the heating wire 150 may be disposed on the upper surface of the support film 811, and the first terminal 150T1 and the second terminal 150T2 of the heating wire 150 may be disposed in the support film 811. As a specific example, the first terminal 150T1 and the second terminal 150T2 of the heating wire 150 may be disposed in a hole (i.e., a hole of the support film 811) penetrating the support film 811 along the Z-axis direction.

Furthermore, as illustrated in FIG. 22, at least one relay terminal may be further disposed on the plate 812. For example, the first and second relay terminals 812T1 and 812T2 may be disposed on the extension portion 812b of the plate 812. In such a case, the first relay terminal 812T1 may be disposed to correspond to the first terminal 150T1 of the heating wire 150, and the second relay terminal 812T2 may be disposed to correspond to the second terminal 150T2 of the heating wire 150. In other words, the first relay terminal 812T1 may be disposed to overlap the first terminal 150T1 of the heating wire 150, and the second relay terminal 812T2 may be disposed to overlap the second terminal 150T2 of the heating wire 150.

As illustrated in FIG. 23, the first relay terminal 812T1 may be disposed in the plate 812. Furthermore, the second relay terminal 812T2 may also be disposed in the plate 812. As a specific example, the first relay terminal 812T1 and the second relay terminal 812T2 may be disposed in a hole penetrating the plate 812 along the Z-axis direction (i.e., a hole of the plate 812). In such a case, as illustrated in FIG. 23, the first relay terminal 812T1 may be connected to the first terminal 150T1 thereabove. In an embodiment, the second relay terminal 812T2 may be connected to the second terminal 150T2 thereabove.

In an embodiment, the first relay terminal 812T1 and the second relay terminal 812T2 in FIG. 22 may be connected to the test board 200 therebelow. An example of such a case may refer to the example of FIG. 21 described above. For example, the first relay terminal 812T1 may be connected to a first power terminal 200T1 disposed on the board of the test board 200, and the second relay terminal 812T2 may be connected to a second power terminal 200T2 disposed on the board of the test board 200. In such a case, the first power terminal 200T1 may be disposed immediately below the first relay terminal 812T1 so as to overlap the first relay terminal 812T1, and the second power terminal 200T2 may be disposed immediately below the second relay terminal 812T2 so as to overlap the second relay terminal 812T2. In such a case, the first power terminal 200T1, the first relay terminal 812T1, and the first terminal 150T1 may be arranged in a row along the Z-axis direction to overlap each other, and the second power terminal 200T2, the second relay terminal 812T2 and the second terminal 150T2 may be arranged in a row along the Z-axis direction to overlap each other.

The first relay terminal 812T1 may be disposed between the first terminal 150T1 of the heating wire 150 and the first power terminal 200T1 of the test board 200 to relay electrical connection between the first power terminal 200T1 and the first terminal 150T1, and the second relay terminal 812T2 may be disposed between the second terminal 150T2 of the heating wire 150 and the second power terminal 200T2 of the test board 200 to relay electrical connection between the power terminal 200T2 and the second terminal 150T2.

The first power terminal 200T1 may be connected, for example, to a positive polarity terminal of the power supply 600 described above, and the second power terminal 200T2 may be connected, for example, to a negative polarity terminal (or a ground terminal) of the power supply 600 described above. A positive voltage from the power supply 600 may be supplied to the first terminal 150T1 of the heating wire 150 through the first power terminal 200T1 and the first relay terminal 812T1, and a negative voltage from the power supply 600 may be supplied to the second terminal 150T2 of the heating wire 150 through the second power terminal 200T2 and the second relay terminal 812T2. The heating wire 150 may generate heat by receiving the positive and negative voltages from the power supply 600.

The first relay terminal 812T1 and the second relay terminal 812T2 may each include a metal conductor. Furthermore, the first relay terminal 812T1 and the second relay terminal 812T2 may each include at least one conductive particle. The detailed description of the conductive particles will refer to the description of the conductive particles of the signal conductive portion 120T described above.

In an embodiment, the first relay terminal 812T1 and the second relay terminal 812T2 may include the above-described conductive particles and an insulating material surrounding the conductive particles. In such a case, since opposite ends of the insulating material expose the conductive particles, the conductive particles exposed to opposite ends of the insulating material may be connected to the terminal of the above-described heating wire and the power terminal of the test board.

As such, the embodiment of FIGS. 22 and 23 has a structure in which the terminal of the heating wire, the relay terminal, and the power terminal are arranged in a row along the Z-axis direction and directly contact each other to receive power, thereby achieving excellent properties in terms of manufacturing-related aspects (e.g., manufacturing method and manufacturing cost, etc.) and thermal efficiency.

In another embodiment, the support film 812 may be disposed below the plate 811, for example. In other words, the support film 812 may be disposed between the plate 811 and the test board 200 (e.g., the board of the test board 200). However, in such a case, the first power terminal 200T1 and the second power terminal 200T2 of the test board 200 may be directly connected to the first terminal 150T1 and the second terminal of the heating wire 150 provided on the support film 812, respectively, and thus the first relay terminal 811T1 and the second relay terminal 811T2 of the plate 811 may be omitted.

In an embodiment, the heating wire 150 of FIG. 22 may have any one shape among the shapes of the first to third heating wires 151, 152, and 153 of FIG. 5, the first to fourth heating wires 151, 152, 153, and 154 of FIG. 6, and the heating wire 150 of FIG. 7.

The connection portion 120 of FIGS. 22 and 23 may include a first insulating portion 121, a plurality of signal conductive portions 120T2, and a second insulating portion 122, and the connection portion 120 of FIGS. 22 and 23 is substantially the same as the connection portion 120 of FIG. 18 described above, so a detailed description of the connection portion 120 of FIGS. 22 and 23 will refer to FIG. 18 and the related description.

Figure 24:
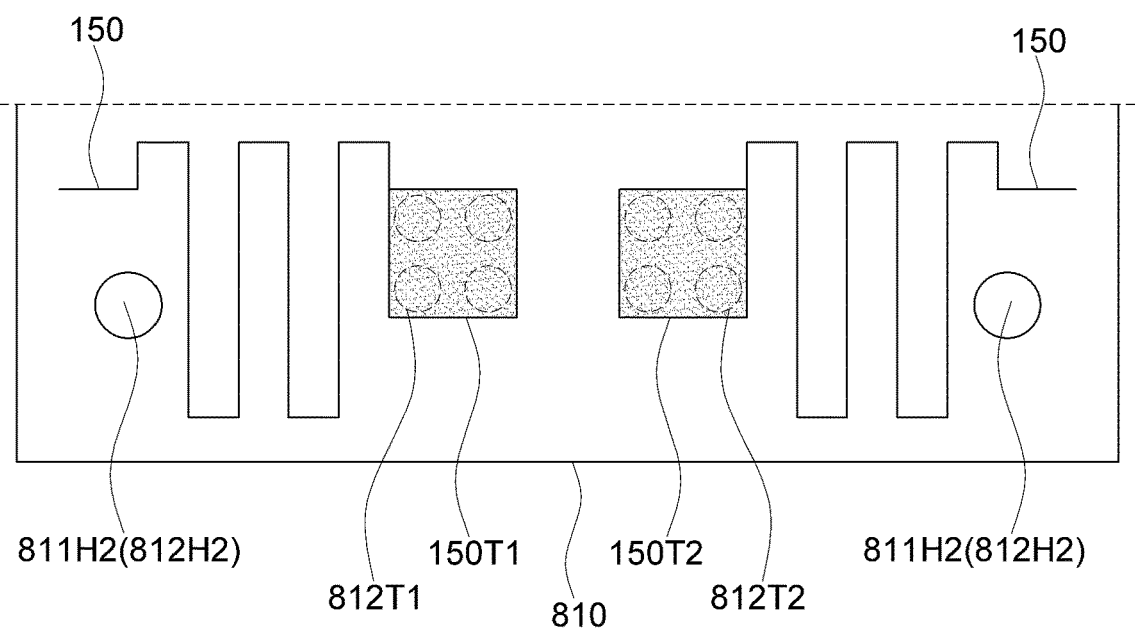
FIG. 24 is a view illustrating a peripheral portion of a terminal of a support film of FIG. 19.

FIG. 24 is a view illustrating a peripheral portion of the terminal of the support film of FIG. 19.

As illustrated in FIG. 24, the terminal of the heating wire 150 may have a different shape from that of the relay terminal. For example, the first terminal 150T1 and the second terminal 150T2 may each have a quadrangular shape, and the first relay terminal 812T1 and the second relay terminal 812T2 may each have a circular shape.

In an embodiment, as illustrated in FIG. 24, the terminal of the heating wire 150 may have a different size from that of the relay terminal. For example, the first terminal 150T1 may have a larger size than the size of the first relay terminal 812T1 overlapping therewith. Similarly, the second terminal 150T2 may have a larger size than the size of the second relay terminal 812T2 overlapping therewith.

In an embodiment, a plurality of relay terminals may be provided. For example, as illustrated in FIG. 24, the first relay terminal 812T1 may include four first relay terminals 812T1 adjacent to each other, and the second relay terminal 812T2 may include four second relay terminals 812T2 adjacent to each other. Herein, all four first relay terminals 812T1 may be connected to the first terminal 150T1 and the first power terminal 200T1, and all four second relay terminals 812T2 may be connected to the second terminal 150T2 and the second power terminal 200T2.

The first terminal 150T1, the second terminal 150T2, the first relay terminal 812T1, and the second relay terminal 812T2 of FIG. 22 may have substantially the same shape as those of the first terminal 150T1, the second terminal 150T2, the first relay terminal 812T1 and the second relay terminal 812T2 of FIG. 24 described above, respectively.

Figure 25:
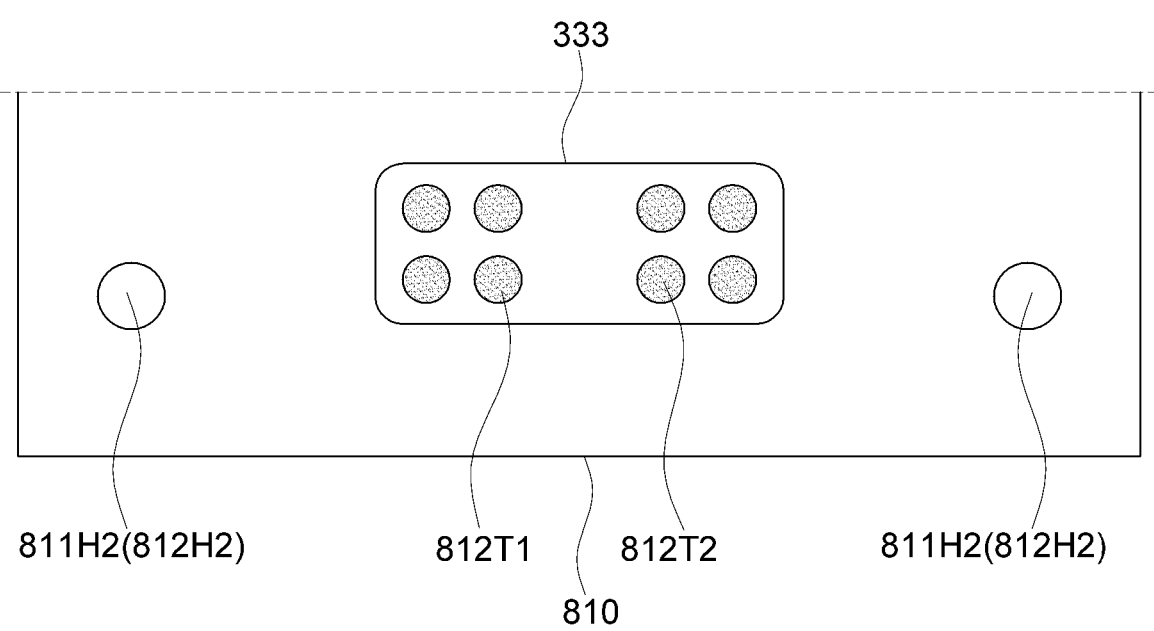
FIG. 25 is a view illustrating a peripheral portion of a relay terminal of a plate of FIG. 19.

FIG. 25 is a view illustrating a peripheral portion of the relay terminal of the plate of FIG. 19.

As illustrated in FIG. 25, the plurality of first relay terminals 812T1 and the plurality of second relay terminals 812T2 may be surrounded by an insulating material 333.

In an embodiment, the insulating material 333 may include a first insulating material that selectively surrounds only the first relay terminals 812T1 among the first relay terminals 812T1 and the second relay terminals 812T2, and a second insulating material that selectively surrounds only the second relay terminals 812T2.

Those skilled in the art to which the present disclosure pertains will understand that this disclosure may be implemented in other specific forms without changing its technical idea or essential features. Accordingly, the embodiments described above should be understood in all respects as illustrative and not restrictive. The scope of the present disclosure is indicated by the scope of the claims described below rather than the detailed description above, and it should be construed that all changes or modified forms derived from the meaning and scope of the claims and their equivalent concepts are included in the scope of the present specification.

The above detailed description is illustrative of the present disclosure. Furthermore, the foregoing describes preferred embodiments of the present disclosure, and the present disclosure may be used in various other combinations, modifications, and environments. That is, changes or modifications may be made within the scope of the inventive concept disclosed in this disclosure, the scope equivalent to the written disclosure, and/or the scope of technology or knowledge in the art. Accordingly, the detailed description of the disclosure above is not intended to limit the disclosure to the disclosed embodiments. Furthermore, the appended claims should be construed to include other embodiments as well.

INDUSTRIAL APPLICABILITY

The test socket according to the present disclosure may simplify the equipment required for burn-in tests, so there are no space restrictions, costs may be reduced, and heat loss may be reduced and rapid heat transfer may be possible to shorten the burn-in test time, thereby contributing to technological improvement in the test socket field because partial characteristic tests of the device under test may be possible, the coupling process between the frame and socket guide may be performed more smoothly, and excellent characteristics in terms of manufacturing-related aspects (e.g., manufacturing method and manufacturing cost, etc.) and thermal efficiency may be achieved.

What is claims is:

1. A test socket comprising:
 a connection portion;
 a frame supporting the connection portion; and
 a heating wire disposed on the frame,
 wherein the frame comprises:
 a plate; and
 a support film disposed on top of the plate;
 wherein the heating wire is disposed on the support film;
 the test socket further comprising a relay terminal disposed in a hole penetrating the plate,
 wherein an upper portion of the relay terminal overlaps and contacts a terminal of the heating wire, and a lower portion of the relay terminal overlaps and contacts a power terminal of a test board; and
 wherein the connection portion comprises an anisotropic conductive sheet, and the anisotropic conductive sheet includes an insulating portion of an elastic insulating material and a conductive portion including at least one conductive particle.

2. The test socket according to claim 1, wherein the heating wire is disposed on at least one surface of a first surface and a second surface of the frame.

3. The test socket according to claim 2, wherein the first surface of the frame is a surface facing a socket guide, and the second surface of the frame is a surface opposite to the first surface.

4. The test socket according to claim 3, wherein at least a portion of the heating wire is disposed between the first surface of the frame and the socket guide.

5. The test socket according to claim 3, wherein at least a portion of the heating wire is disposed between the second surface of the frame and a test device.

6. The test socket according to claim 1, wherein the heating wire is printed or deposited onto the frame.

7. The test socket according to claim 1, wherein the frame includes:
 a main body having a connection hole; and
 an extension portion extending from the main body.

8. The test socket according to claim 7, wherein a terminal of the heating wire is disposed on the extension portion.

9. The test socket according to claim 1, wherein the heating wire surrounds a center of the frame and includes a plurality of heating wires respectively arranged at different distances from the center of the frame.

10. The test socket according to claim 1, wherein the heating wire includes a plurality of heating wires arranged along different sides of the frame, respectively.

11. The test socket according to claim 1, wherein the frame includes at least one coupling hole, and
 at least a portion of the heating wire has a shape surrounding the coupling hole.

12. The test socket according to claim 1, wherein the connection portion further includes a support sheet on the anisotropic conductive sheet.

13. A test socket comprising:
 a connection portion;
 a frame supporting the connection portion;

a heating wire disposed on the frame; and a socket guide disposed on the frame, wherein the frame comprises:

a plate; and a support film disposed on top of the plate;

wherein the heating wire is disposed on the support film;

the test socket further comprising a relay terminal disposed in a hole penetrating the plate, wherein an upper portion of the relay terminal overlaps and contacts a terminal of the heating wire, and a lower portion of the relay terminal overlaps and contacts a power terminal of a test board; and wherein the connection portion comprises an anisotropic conductive sheet, and the anisotropic conductive sheet includes an insulating portion of an elastic insulating material and a conductive portion including at least one conductive particle.

14. The test socket according to claim 13, wherein at least a portion of the heating wire overlaps the socket guide.

15. The test socket according to claim 13, wherein at least a portion of the heating wire contacts the socket guide.

\* \* \* \* \*